US012660514B2

(12) United States Patent
Lee et al.

(10) Patent No.: US 12,660,514 B2
(45) Date of Patent: Jun. 16, 2026

(54) SUPERCONDUCTING QUANTUM INTERFEROMETRIC DEVICE AND MANUFACTURING METHOD

(71) Applicants: Samsung Electronics Co., Ltd., Suwon-si (KR); POSTECH Research and Business Development Foundation, Pohang-si (KR)

(72) Inventors: Jaehyeong Lee, Suwon-si (KR); Gilho Lee, Pohang-si (KR); Jinhyoun Kang, Suwon-si (KR); Jaeho Shin, Suwon-si (KR); Seunghan Lee, Pohang-si (KR); Daeseok Han, Suwon-si (KR)

(73) Assignees: Samsung Electronics Co., Ltd., Suwon-si (KR); POSTECH Research and Business Development Foundation, Pohang-si (KR)

( * ) Notice: Subject to any disclaimer, the term of this patent is extended or adjusted under 35 U.S.C. 154(b) by 574 days.

(21) Appl. No.: 18/194,539

(22) Filed: Mar. 31, 2023

(65) Prior Publication Data

US 2024/0138271 A1     Apr. 25, 2024
US 2024/0237558 A9     Jul. 11, 2024

(30) Foreign Application Priority Data

Oct. 24, 2022     (KR) ........................ 10-2022-0137655

(51) Int. Cl.
*H10N 69/00*          (2026.01)
(52) U.S. Cl.
CPC ................................... *H10N 69/00* (2023.02)

(58) Field of Classification Search
CPC .... H10N 60/0912; H10N 60/12; H10N 69/00; H10N 60/805; H10N 60/815; H10N 99/05
(Continued)

(56) References Cited

U.S. PATENT DOCUMENTS 8,111,083 B1      2/2012 Pesetski et al.
2003/0038285 A1*  2/2003 Amin ................. H10N 60/0941
                                                    257/E39.015
(Continued)

FOREIGN PATENT DOCUMENTS

JP        2021-536666 A      12/2021

OTHER PUBLICATIONS

Nanda, Gaurav, et al. "Current-Phase Relation of Ballistic Graphene Josephson Junctions." Nano Letters 17.6 (2017): 3396-3401.
(Continued)

*Primary Examiner* — Didarul A Mazumder
(74) *Attorney, Agent, or Firm* — NSIP Law

(57) ABSTRACT

A superconducting quantum interferometric device (SQUID) includes: a conductive material region formed on a partial region of a substrate; a first superconducting material layer including a first loop including first and second extension units that are spaced apart from each other to form a proximity Josephson junction and that form a stack structure with the conductive material region; a second superconducting material layer including a second loop including first and second end units spaced apart from each other; and a tunnel Josephson junction formed by a stack structure including a tunnel thin film layer forming and the first and second end units, wherein at least a portion of the second loop forms a stack structure with the first loop.

10 Claims, 22 Drawing Sheets

(58) Field of Classification Search
USPC ........................................................ 257/32
See application file for complete search history.

(56) References Cited

U.S. PATENT DOCUMENTS

| | | | |
|---|---|---|---|
| 2007/0281861 A1* | 12/2007 | Ishimaru .............. | H10N 60/124 |
| | | | 505/100 |
| 2009/0153180 A1 | 6/2009 | Herr | |
| 2009/0322374 A1 | 12/2009 | Przybysz et al. | |
| 2019/0296210 A1* | 9/2019 | Brink ..................... | B82Y 10/00 |
| 2020/0152854 A1* | 5/2020 | Sandberg .............. | H10N 60/83 |
| 2021/0280764 A1* | 9/2021 | Topaloglu .............. | H10N 60/80 |
| 2022/0131064 A1* | 4/2022 | Deng ..................... | H10N 60/12 |

OTHER PUBLICATIONS

Kayyalha, Morteza, et al. "Highly skewed current-phase relation in superconductor-topological insulator-superconductor Josephson junctions." npj Quantum Materials 5.1 (2020): (7 pages).

Lee, Gil-Ho, et al. "Ultimately short ballistic vertical graphene Josephson junctions." Nature communications 6.1 (2015): 6181, (22 pages).

Li, Chuan, et al. "Zeeman-Effect-Induced 0-$\pi$ Transitions in Ballistic Dirac Semimetal Josephson Junctions." Physical review letters 123.2 (2019): 026802., (10 pages).

Spanton, Eric M., et al. "Current-phase relations of few-mode InAs nanowire Josephson junctions." Nature Physics 13.12, arXiv:1701.01188v1 [cond-mat.mes-hall] Jan. 5, 2017: (30 pages).

Tolpygo, S. K., et al. "Electric stress effect on Josephson tunneling through ultrathin AlOx barrier in Nb/Al/AlOx/Nb junctions." J. Appl. Phys 104: 063904-1., Sep. 19, 2008 (11 pages).

Cyster, M. J., et al. "Effect of atomic structure on the electrical response of aluminum oxide tunnel junctions." Physical Review Research 2.1 (2020): 013110., (10 pages).

Julin, J. K., et al. "Reduction of low-frequency 1/f noise in Al-AlOx-Al tunnel junctions by thermal annealing." Applied physics letters 97.15 (2010)., (4 pages).

Cyster, M. J., et al. "Simulating the fabrication of aluminium oxide tunnel junctions" Npj Quantum Inf. 7. (2021)., (21 pages).

Osman, A., et al. "Simplified Josephson-junction fabrication process for reproducibly high-performance superconducting qubits." Applied Physics Letters 118.6 (2021)., (7 pages).

Meschke, Matthias, et al. "Tunnel Spectroscopy of a Proximity Josephson Junction." Physical Review B 84.21 (2011): 214514. arXiv:1105.3875 [cond-mat.supr-con] May 19, 2011, (5 pages).

Indolese, David I., et al. "Compact SQUID Realized in a Double-Layer Graphene Heterostructure." Nano letters 20.10 (2020): 7129-7135.

* cited by examiner

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

FIRST DIRECTION

SECOND DIRECTION

SUPERCONDUCTING QUANTUM INTERFEROMETRIC DEVICE AND MANUFACTURING METHOD

CROSS-REFERENCE TO RELATED APPLICATIONS

This application is based on and claims priority under 35 U.S.C. § 119 to Korean Patent Application No. 10-2022-0137655, filed on Oct. 24, 2022, in the Korean Intellectual Property Office, the disclosure of which is incorporated by reference herein in its entirety.

BACKGROUND

1. Field

The disclosure relates to a superconducting quantum interferometric device (SQUID) and manufacturing method.

2. Description of Related Art

A superconducting quantum interferometric device (SQUID) may include, for example, two Josephson junctions or one Josephson junction and a superconducting loop. When manufacturing such a SQUID, because an increase in the number production steps generally leads to a decrease in yield, minimizing the number of production steps can be beneficial.

E-beam lithography, which is used to manufacture Josephson junctions, by itself leaves many impurities in a SQUID, and contamination by resist leads to performance degradation.

SUMMARY

According to an aspect of the disclosure, a superconducting quantum interferometric device includes: a conductive material region formed on a partial region of a substrate; a first superconducting material layer including a first loop including first and second extension units that are spaced apart from each other to form a proximity Josephson junction and that form a stack structure with the conductive material region; a second superconducting material layer including a second loop including first and second end units spaced apart from each other; and a tunnel Josephson junction formed by a stack structure including a tunnel thin film layer forming and the first and second end units, wherein at least a portion of the second loop forms a stack structure with the first loop.

The tunnel thin film layer may cover at least a portion of the first loop, and a Josephson junction may be formed between the first loop and the second loop.

The first superconducting material layer may include a third end unit and a fourth end unit spaced apart from each other, and the first and second extension units may extend relative to the third and fourth end units.

The first loop and the second loop may have respectively corresponding loop dimensions, and the first superconducting material layer and the second superconducting material layer may form a stack structure in which the second superconducting material layer is offset by a first distance with respect to the first superconducting material layer.

A direction of offset of the second superconducting material layer with respect to the first superconducting material layer and an extension direction of the first and second extension units may be opposite to or perpendicular to each other.

The first end unit of the second superconducting material layer may include one protrusion to form one tunnel Josephson junction or may include a plurality of protrusions to form a plurality of tunnel Josephson junctions.

The tunnel thin film layer may include an oxide of superconducting material.

The tunnel thin film layer may be formed by oxidizing a partial thickness of the first superconducting material layer.

The first superconducting material layer or the second superconducting material layer may include aluminum or niobium.

The conductive material region may include graphene, a two-dimensional material, transition metal dichalcogenides (TMDC), a semiconductor material, or a metal material.

In one general aspect, a method of manufacturing a superconducting quantum interferometric device includes: forming a conductive material region on only a partial region of a substrate; forming a loop pattern on the substrate by layering a resist layer on the substrate and forming a loop pattern in the resist layer, wherein the loop pattern includes a first separation structure pattern including end units spaced apart from each other at a first portion of the loop pattern, wherein the loop pattern includes a second separation structure pattern at a second portion of the loop pattern, and wherein first and second extension patterns spaced apart from each other extend from the second separation structure pattern to expose a portion of the conductive material region; depositing a base material for forming a first superconducting material layer with respect to the loop pattern, thereby forming the first superconducting material layer into a first loop corresponding to the first loop pattern, and forming a proximity Josephson junction by providing first and second extension units spaced apart from each other that form a stack structure with the conductive material region; forming a tunnel thin film layer to cover at least a portion of the first superconducting material layer; depositing a base material for forming a second superconducting material layer with respect to the loop pattern, thereby forming a second loop of the second superconducting material layer that is offset with respect to the first loop, wherein the second loop forms a stack structure with at least a portion of the first loop, and forms a tunnel Josephson junction in which a first end unit and a second end unit spaced apart from each other of a first separation structure form a stack structure with the tunnel thin film layer; and removing the resist layer.

The tunnel thin film layer may be provided to cover at least a portion of the first loop to form a Josephson junction between the first loop and the second loop.

The first superconducting material layer may further include a second separation structure including a third end unit and a fourth end unit that are spaced apart from each other and that correspond to the second separation structure pattern of the loop pattern, and the first and second extension units may extend from the third end unit and the fourth end unit.

The loop pattern in the resist layer may include a double layer structure having pattern openings with different respective widths.

15The first end unit of the second superconducting material layer may include one protrusion to form one tunnel Josephson junction, or may include a plurality of protrusions to form a plurality of tunnel Josephson junctions.

The tunnel thin film layer may be formed of an oxide of a superconducting material.

The first superconducting material layer or the second superconducting material layer may include aluminum or niobium.

The conductive material region may include graphene, a two-dimensional material, transition metal dichalcogenides (TMDC), a semiconductor material, or a metal material.

The tunnel thin film layer may be formed by oxidizing a partial thickness of the first superconducting material layer.

An offset direction of the second superconducting material layer with respect to the first superconducting material layer and an extension direction of the first and second extension units may be opposite or perpendicular to each other.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
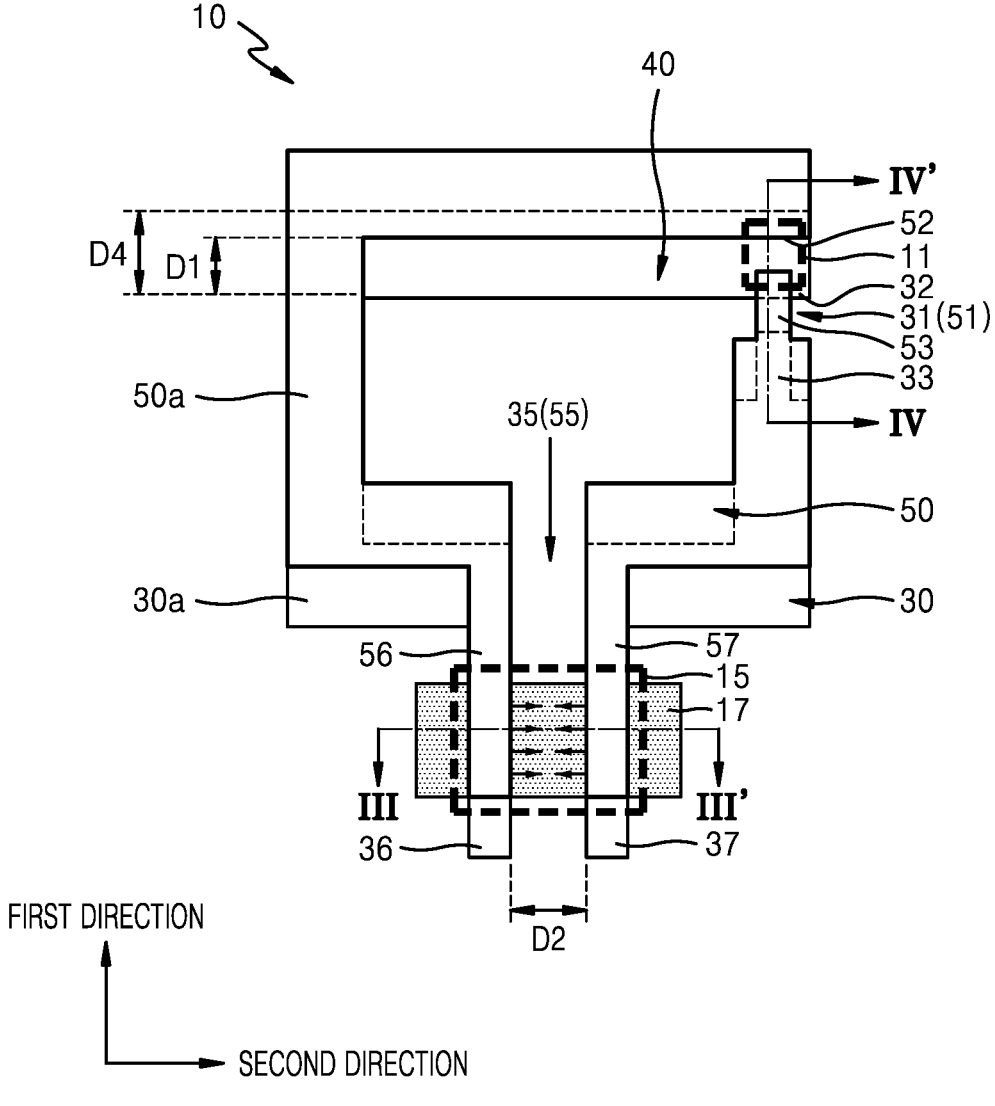
FIG. 1 shows a superconducting quantum interferometric device (SQUID), according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure.

The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

Reference will now be made in detail to embodiments, examples of which are illustrated in the accompanying drawings, wherein same or like reference numerals refer to same or like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

E-beam lithography, used to manufacture Josephson junctions, may leave impurities in a SQUID, and contamination by resist coating may lead to performance degradation of a SQUID. Therefore, when manufacturing a SQUID, it is beneficial to minimize the number of resist coating processes.

Described herein ae SQUIDs, and methods of manufacturing SQUIDS, that are capable of minimizing the number of resist coating processes. Such SQUIDs may include different types of Josephson junction devices and a method of manufacturing the same. SQUIDs may become capable of minimizing contamination due to an unnecessary the number of manufacturing steps by simplifying the production process, which may also prevent a decrease in yield in the bandage process (for manufacturing a SQUID).

A superconducting quantum interferometric device (SQUID) according to one or more embodiments includes a conductive material region formed on a partial region of a substrate, a first superconducting material layer forming a first loop and forming a proximity Josephson junction by including first and second extension units that are spaced apart from each other and form a stack structure with the conductive material region, a second superconducting material layer forming a second loop and having a first separation structure including first and second end units spaced apart from each other, and a tunnel thin film layer forming a tunnel Josephson junction by being provided to form a stack structure with the first and second end units of the first separation structure, wherein at least a portion of the second loop of the second superconducting material layer is provided to form a stack structure with the first loop of the first superconducting material layer. The tunnel thin film layer is provided to cover at least a portion of the first loop of the first superconducting material layer, and a Josephson junction may be formed between the first loop and the second loop. The first loop and the second loop have shapes corresponding to each other, the second superconducting material layer forms a stack structure in which the second superconducting material layer is shifted by a first width with respect to the first superconducting material layer, and a shift direction of the second superconducting material layer with respect to the first superconducting material layer and an extension direction of the first and second extension units may be opposite or cross each other.

Figure 2:
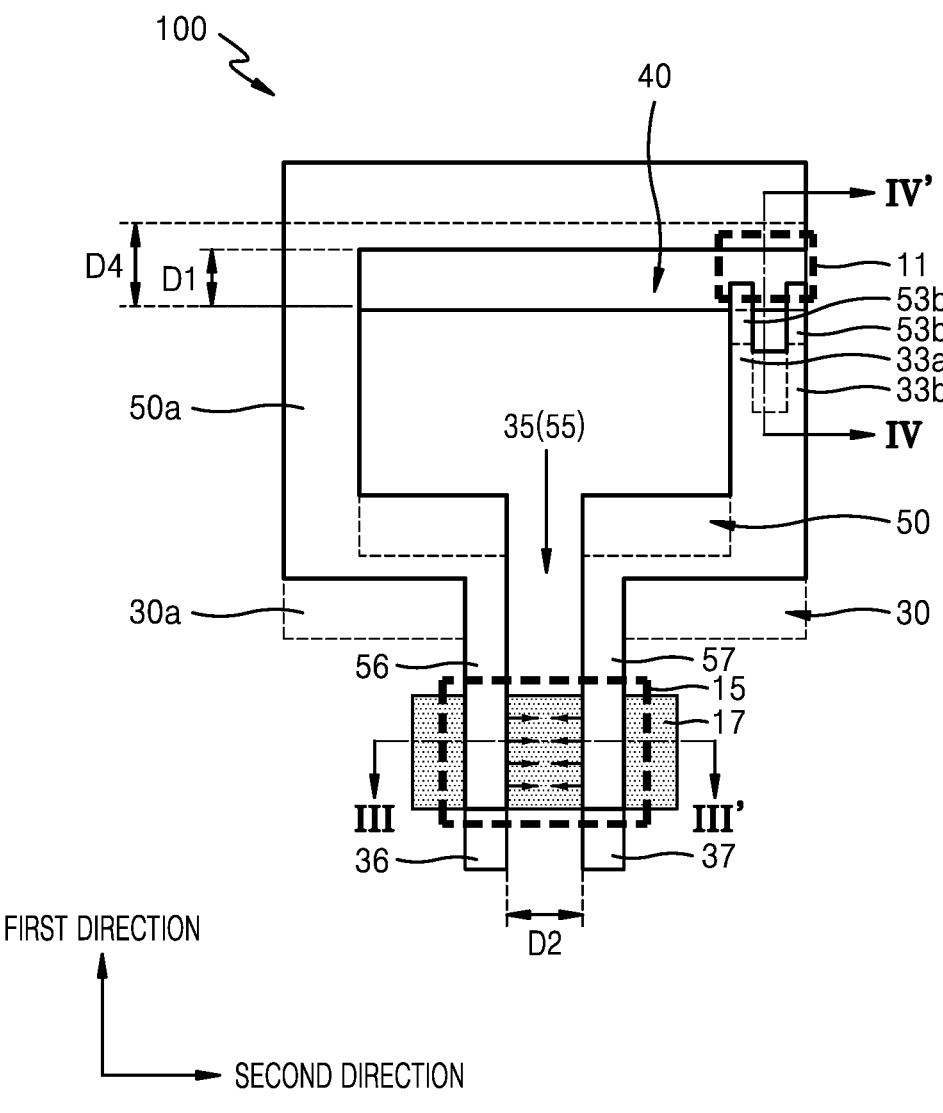
FIG. 2 shows a SQUID, according to one or more embodiments.
Figure 3:
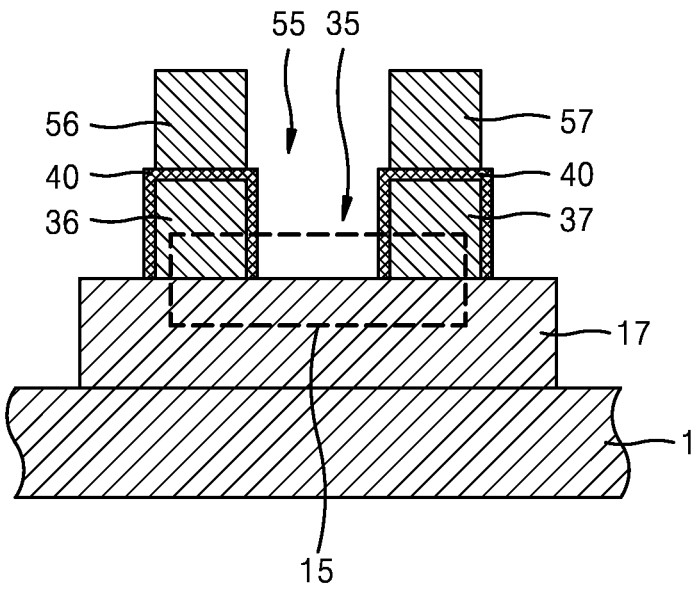
FIG. 3 shows a cross-sectional view taken along line III-III' of FIGS. 1 and 2.
Figure 4:
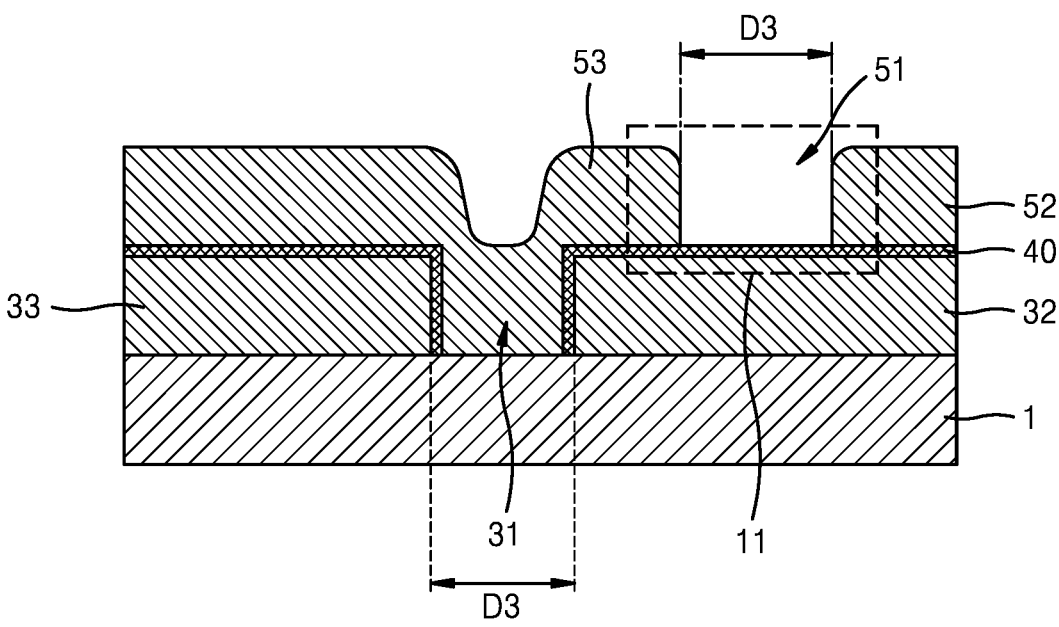
FIG. 4 shows a cross-sectional view taken along line IV-IV' of FIGS. 1 and 2.

FIGS. 1 and 2 show superconducting quantum interferometric devices (SQUIDs) 10 and 100 according to one or more embodiments. The example SQUID 10 shown in FIG. 1 includes one proximity Josephson junction 15 and one tunnel Josephson junction 11. The example SQUID 100 shown in FIG. 2 includes one proximity Josephson junction 15 and a plurality of tunnel Josephson junctions 11, for example, connected in parallel with respect to each other. FIG. 3 is a cross-sectional view taken along line III-Ill' in FIGS. 1 and 2. FIG. 4 is a cross-sectional view taken along line IV-IV' in FIGS. 1 and 2. That is, FIGS. 3 and 4 show a view from a viewpoint, roughly from points at the bottoms of FIGS. 1 and 2, respectively, and looking toward the SQUIDS 10, 100 (i.e., end-on of the extensions units 35, 37, 56 and 57).

Referring to FIGS. 1 to 4, the SQUIDs 10 and 100 may include a conductive material region 17, a first superconducting material layer 30, a tunnel thin film layer 40, and a second superconducting material layer 50 (above the first superconducting material layer 30 in FIGS. 1 and 2). The first superconducting material layer 30 forms a first loop 30a and includes first and second extension units 36 and 37 spaced apart from each other. The first and second extension units 36 and 37 may form a stack structure with (i.e., stacked upon) the conductive material region 17 to form a proximity Josephson junction 15. The second superconducting material layer 50 forms a second loop 50a and includes a first separation structure 51 including a first end unit 53 and a second end unit 52 spaced apart from each other by a first distance in a first direction. The tunnel thin film layer 40 may be provided to form a stack structure with (i.e., be stacked/layered on) the first end unit 53 and the second end unit 52 of the first separation structure 51. Accordingly, the first end unit 53 of the second superconducting material layer 50, the tunnel thin film layer 40, and the second end unit 52 of the second superconducting material layer 50 may form a tunnel Josephson junction 11.

The conductive material region 17, the first superconducting material layer 30, the tunnel thin film layer 40, and the second superconducting material layer 50 may be sequentially stacked (in that order) on a substrate 1. In this case, the proximity Josephson junction 15 may be formed between the conductive material region 17 and the first superconducting material layer 30, of which the first and second extension units 36 and 37, for example are formed. In addition, tunnel Josephson junction 11 may be formed between the tunnel thin film layer 40 and the second superconducting material layer 50, of which the first and second end units 53 and 52, for example, are formed. As another example, the first superconducting material layer 30, the tunnel thin film layer 40, the second superconducting material layer 50, and the conductive material region 17 may be sequentially stacked on the substrate 1. In this case, the tunnel Josephson junction 11 may be formed between the first superconducting material layer 30 and the tunnel thin film layer 40, and the proximity Josephson junction 15 may be formed between the second superconducting material layer 50 and the conductive material region 17.

For example, when the conductive material region 17, the first superconducting material layer 30, the tunnel thin film layer 40, and the second superconducting material layer 50 are sequentially stacked on the substrate 1, the conductive material region 17 may be formed on a partial region of the substrate 1 to form a proximity Josephson junction 15 by forming a stack structure with the first and second extension units 36 and 37, which are spaced apart from each other and which are formed in the first superconducting material layer 30. And, the tunnel thin film layer 40 may be formed on at least a partial region of the first superconducting material layer 30 to form a stack structure with the first end unit 53 and the second end unit 52, which are spaced apart from each other and which are formed in the second superconducting material layer 50. For example, the tunnel thin film layer 40 may be formed to cover a part or all of the first superconducting material layer 30. As another example, when the second superconducting material layer 50, the tunnel thin film layer 40, the first superconducting material layer 30, and the conductive material region 17 are sequentially stacked on the substrate 1, the tunnel thin film layer 40 may be formed on at least a partial region of the second superconducting material layer 50 to form a stack structure with the first end unit 53 and the second end unit 52, which are spaced apart from each other and which are formed in the second superconducting material layer 50. For example, the tunnel thin film layer 40 may be formed to cover a part or all of the second superconducting material layer 50 overlapping the first superconducting material layer 30. The conductive material region 17 may be formed on the second superconducting material layer 50 corresponding to a partial region of the substrate 1 to form a proximity Josephson junction 15 by forming a stack structure with the first and second extension units 36 and 37, which are spaced-apart from each other and which are formed in the first superconducting material layer 30.

Hereinafter, a case in which the conductive material region 17, the first superconducting material layer 30, the tunnel thin film layer 40, and the second superconducting material layer 50 are sequentially stacked on the substrate 1 is described as an example, but embodiments are not limited thereto. Modifications according to changes in the stacking order may be made from embodiments described below; duplicative illustrations and descriptions pertaining to such variations are omitted.

The conductive material region 17 may be formed, on a partial region of the substrate 1, which a shape and location configured to correspond to the first and second extension units 36 and 37. The conductive material region 17 may be formed of a conductive material (generally, a non-superconductor), and for example, of a material that may be deposited as a single layer. The conductive material region 17 may be or include, for example, graphene, a two-dimensional material, or transition metal dichalcogenides (TMDC). Also, the conductive material region 17 may be or include, for example, a semiconductor material or a metal material.

The first superconducting material layer 30 may form a first loop 30a and include the first and second extension units 36 and 37, and forming a stack structure with the conductive material region 17 to form the proximity Josephson junction 15. The first superconducting material layer 30 may be or include, for example, aluminum or niobium.

The first superconducting material layer 30 may include a second separation structure 35 including a third end unit and a fourth end unit spaced apart by a second distance D2 across a second direction. The first and second extension units 36 and 37 may extend from the third and fourth end units of the second separation structure 35 in a direction different from the second direction (opposite the first direction). The second direction may be perpendicular to the first direction, which is also a shift direction of the second superconducting material layer 50 with respect to the first superconducting material layer 30. Also, for example, when a shift direction of the second superconducting material layer 50 with respect to the first superconducting material layer 30 is a +first direction, the first and second extension units 36 and 37 may extend in a −first direction from the second separation structure 35 of the first loop 30a. As shown as an example in FIGS. 1 and 2, the first and second extension units 36 and 37 are in a direction perpendicular to the second direction and may extend in a direction opposite to the shift/first direction, but embodiments are not limited thereto. For example, the first and second extension units 36 and 37 may extend to the inside of the first loop 30a, and in this case, the direction in which the first and second extension units 36 and 37 extend and the shift direction may be the same. When the first and second extension units 36 and 37 extend to the inside of the first loop 30a, the conductive material region 17 may be correspondingly positioned (or extend to) inside the first loop 30a.

The second superconducting material layer 50 may form a second loop 50a and have a first separation structure 51 including the first end unit 53 and the second end unit 52 separated by a first separation distance D3 (refer to FIG. 4) in the first direction. At least a portion of the second loop 50a of the second superconducting material layer 50 may stacked on, and overlap with, the first loop 30a of the first superconducting material layer 30. For example, the first loop 30a of the first superconducting material layer 30 and the second loop 50a of the second superconducting material layer 50 may have shapes closely (but not necessarily exactly) corresponding to each other, and may be arranged to form a stack structure in which the second superconducting material layer 50 is shifted by a first distance D1 in the first direction with respect to the first superconducting material layer 30. The second superconducting material layer 50 may be shifted with respect to the first superconducting material layer 30 by, for example, the first distance D1 in a +first direction. The second superconducting material layer 50 may be or may include, for example, aluminum and/or niobium. The first distance D1 by which the second superconducting material layer 50 is shifted with respect to the first superconducting material layer 30 may be greater than the first separation distance D3 between the first end unit 53 and the second end unit 52 of the second superconducting material layer 50 and less than a distance D4 that is a width of the first loop 30a of the first superconducting material layer 30 in the first direction.

The tunnel thin film layer 40 may be provided to form the tunnel Josephson junction 11 in the first separation structure 51 of the second superconducting material layer 50. For example, the tunnel thin film layer 40 may be provided to form a stack structure with the first end unit 53 and the second end unit 52, and thus, the tunnel Josephson junction 11 may be formed at the first end unit 53, the tunnel thin film layer 40, and the second end unit 52. In addition, the tunnel thin film layer 40 may be provided to cover at least a part or all of the first loop 30a of the first superconducting material layer 30, and thus, a Josephson junction may be formed between the first loop 30a and the second loop 50a, at least a portion of which forms a stack structure.

The tunnel thin film layer 40 may be formed of, for example, an oxide of a superconducting material. For example, the tunnel thin film layer 40 may be formed by oxidizing a partial thickness of the first superconducting material layer 30. The first superconducting material layer 30 may include, for example, aluminum, and, in this case, the tunnel thin film layer 40 may be made of aluminum oxide.

Meanwhile, the first end unit 53 of the second superconducting material layer 50 may have one protrusion, as shown in FIG. 1. In this case, the SQUID 10 according to an embodiment may include one proximity Josephson junction 15 and one tunnel Josephson junction 11.

As another example, the first end unit 53 of the second superconducting material layer 50 may have a plurality of protrusions, for example, two protrusions, as shown in FIG. 2. In this case, the SQUID 100 may include one proximity Josephson junction 15 and a plurality of tunnel Josephson junctions, for example, two tunnel Josephson junctions 11. The number of tunnel Josephson junctions 11 may vary depending on the number of protrusions formed on the first end unit 53 of the second superconducting material layer 50.

Meanwhile, the first loop 30a and the second loop 50a may have shapes corresponding to each other but arranged with an offset. For example, the first loop 30a may further include a first separation structure 31 corresponding to the first separation structure 51 of the second superconducting material layer 50, and the second loop 50a of the second superconducting material layer 50 may further include a second separation structure 55 corresponding to the second separation structure 35 of the first superconducting material layer 30.

That is, as shown with the examples in FIGS. 1 and 2, the first superconducting material layer 30 and the second superconducting material layer 50 may have structures corresponding to each other, for example, the same structure (or profile as viewed from above), and may be formed in a stack structure shifted or offset from each other by the first distance D1, and the tunnel thin film layer 40 may be positioned therebetween. The first superconducting material layer 30 may form the first loop 30a and may include the first extension unit 36 and the second extension unit 37 that face each other. The second superconducting material layer 50 may form the second loop 50a and may include first extension unit 56 and second extension unit 57 that face each other. For example, the conductive material region 17 may form a stack structure with the first extension unit 36 and the second extension unit 37 of the first superconducting material layer 30. The first superconducting material layer 30 may include the first separation structure 31 including a first end unit 33 and a second end unit 32 spaced apart from each other by the first separation distance D3 in the first direction in a first region of the first loop 30a, and a second separation structure 35 including a third end unit and a fourth end unit spaced apart from each other by a second separation distance D2 in the second direction in a second region of the first loop 30a. The first and second extension units 36 and 37 may extend from the third end unit and the fourth end unit in a direction different from the second direction, for example, in a crossing the first direction to face each other.

The second superconducting material layer 50 may include: the first separation structure 51 (including the first end unit 53 and the second end unit 52 spaced apart from each other by the first separation distance D3 in the first direction) in the first region of the second loop 50a, and the second separation structure 55 (including a third end unit and a fourth end unit spaced apart from each other by the second separation distance D2 in the second direction) in the second region of the second loop 50a. The first and second extension units 56 and 57 may extend from the third end unit and the fourth end unit in a direction different from the second direction, for example, in a direction perpendicular to the first direction to face each other.

In this way, the first superconducting material layer 30 and the second superconducting material layer 50 may be formed in structures that correspond to each other, for example, the same structure, and a stacked structure may be formed in which the second superconducting material layer 50 is shifted by the first distance D1 in the first direction, for example, the +first direction with respect to the first superconducting material layer 30. The shifted first width D1 may be determined so that at least a portion of the first end unit 53 of the second superconducting material layer 50 overlaps the second end unit 32 of the first superconducting material layer 30. The tunnel thin film layer 40 may be provided to cover at least the second end unit 32 of the first superconducting material layer 30 that overlaps the first end unit 53 of the second superconducting material layer 50, and the shift may be provided in a direction in which at least a portion of the first end unit 53 of the second superconducting material layer 50 overlaps the tunnel thin-film layer 40 on the second end unit 32 of the first superconducting material layer 30. Accordingly, the tunnel Josephson junction 11 may be formed by a portion of the first separation structure 51 of the second superconducting material layer 50, the first end unit 53 of the second superconducting material layer 50, the tunnel thin film layer 40, and the second end unit 52 of the second superconducting material layer 50.

Meanwhile, the first and second extension units 36 and 37 of the first superconducting material layer 30 and the first and second extension units 56 and 57 of the second superconducting material layer 50 may extend in (or be aligned in) the first direction, for example, a −first direction, and may be shifted or offset from each other by the first distance D1. That is, because of the formation of a stack structure of the second superconducting material layer 50 positionally shifted along first direction by the first distance D1 with respect to the first superconducting material layer 30, the first and second extension units 56 and 57 of the second superconducting material layer 50 are also shifted by the first distance D1 in the first direction with respect to the first and second extension units 36 and 37. In addition, the first and second extension units 36 and 37 of the first superconducting material layer 30 form a stack structure with the conductive material region 17 and thus form a proximity Josephson junction 15 with the conductive material region 17 therebetween. Accordingly, in a region where the proximity Josephson junction 15 is formed, the first and second extension units 56 and 57 of the second superconducting material layer 50 are formed on the first and second extension units 36 and 37, for example, to form a stacked structure with the tunnel thin film layer 40 therebetween. However, because a contact area is relatively large, the second superconducting material layer 50 may act as a superconducting material similar to the first superconducting material layer 30, and a direct contact between the second superconducting material layer 50 and the conductive material region 17 is avoided. Accordingly, the structure does not induce a phase slip or the like due to the existence of the first and second extension units 56 and 57 of the second superconducting material layer 50.

Meanwhile, as shown in the examples of FIGS. 1 and 2, the first end units 33 and 53 of the first superconducting material layer 30 and the second superconducting material layer 50 are respectively formed as protrusions.

As shown in FIG. 1, when the first end units 33 and 53 have one protrusion at the first separation structures 31 and 51, the SQUID 10 includes one tunnel Josephson junction 11. As shown in FIG. 2, when the first end units 33 and 53 have a plurality of protrusions at the first separation structures 31 and 51, the SQUID 100 includes a plurality of tunnel Josephson junctions 11. FIG. 2 shows an example in which the first end units 33 and 53 are provided with two protrusions to form two tunnel Josephson junctions 11.

Meanwhile, the SQUIDs 10 and 100 of FIGS. 1 and 2 show an example in which the shift/offset direction of the second superconducting material layer 50 with respect to the first superconducting material layer 30 are opposite to each other in the first direction. As such, the SQUIDs 10 and 100 may be configured such that (i) the shift direction of the second superconducting material layer 50 with respect to the first superconducting material layer 30 and (ii) the extension direction of the first and second extension units 36 and 37 may be opposite to each other, but embodiments are not limited thereto.

As described above, the SQUIDs 10 and 100 may include: a stack structure in which the second superconducting material layer 50 having the second loop 50a is shifted by the first direction D1 in the first direction with respect to the first superconducting material layer 30 having the first loop 30a; the conductive material region 17 forming a stack structure with the first and second extension units 36 and 37 of the first superconducting material layer 30; and the tunnel thin film layer 40 forming the tunnel Josephson junction 11 with the second superconducting material layer 50 at the first separation structure 51 of the second superconducting material layer 50, and the tunnel thin film layer 40 may be provided to cover at least a part or all of the first loop 30a of the first superconducting material layer 30, such that the SQUIDs 10 and 100 may include one proximity Josephson junction 15 and at least one tunnel Josephson junction 11. As a result, a Josephson junction may be formed between the first loop 30a and the second loop 50a, at least a portion of which forms a stack structure, and accordingly, as shown in the example of FIG. 5, the SQUIDs 10 and 100 in which the proximity Josephson junction 15 and the tunnel Josephson junction 11 are connected to a superconducting loop may be obtained.

Figure 5:
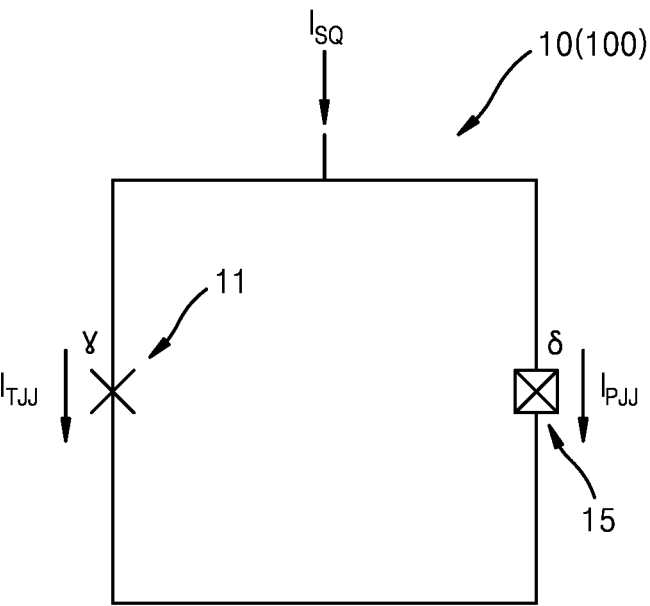
FIG. 5 is a conceptual diagram of a SQUID according to one or more embodiments.

FIG. 5 is a conceptual diagram of SQUIDs 10 and 100 according, to one or more embodiments. The SQUIDs 10 and 100 including a tunnel Josephson junction (tJJ) 11 having a phase difference γ and a proximity Josephson junction (pJJ) 15 having a phase difference δ may be implemented on the superconducting loop (the square in FIG. 5). The tunnel Josephson junction 11 may include one tunnel Josephson junction 11 or a plurality of tunnel Josephson junctions 11 connected in parallel with respect to each other.

In FIG. 5, $I_{SQ}$, is a current applied to the SQUIDs 10 and 100, $I_{TJJ}$ is a current flowing in the tunnel Josephson junction 11, and $I_{PJJ}$ is a current flowing in the proximity Josephson junction 15. $I_{TJJ}$ may depend on a sine function of the phase difference γ. On the other hand, $I_{PJJ}$ may not depend on the sine function of the phase difference δ. In the SQUIDs 10 and 100 according to an embodiment, for example, when the tunnel Josephson junction 11 exhibiting a phase difference γ is a reference junction, the phase difference δ at the proximity Josephson junction 15 may be expressed by the relationship of $\delta=\gamma+2\pi\varphi_a/\varphi_0$, and may be controlled by an external magnetic flux $\varphi_a$. Here, $\varphi_a$ represents an external magnetic flux, and $\varphi_0$ represents a magnetic flux quantum, which may be defined as $\varphi_0=h/(2e)$.

Because the external magnetic flux $\varphi_a$ in the superconducting loop varies depending on a current $I_{SQ}$, applied to the SQUIDs 10 and 100, a current-phase relationship in the proximity Josephson junction 15 may be measured, and by measuring the current-phase relationship, it may be confirmed that the SQUIDs 10 and 100 having the tunnel Josephson junction 11 and the proximity Josephson junction 15 in the superconducting loop function as SQUIDs.

FIGS. 6A to 6H illustrate an example of a one-step fabrication method for manufacturing the SQUIDs 10 and 100 according to embodiments described with reference to FIGS. 1 to 4. Here, the one-step fabrication method means that a resist process may be applied only once to fabricate a device and does not mean that the entire process is performed in only one step. FIGS. 6A to 6H illustrate a process of manufacturing the SQUID 10 (FIG. 1) and the SQUID 100 (FIG. 2), but embodiments are not limited thereto.

Figure 6A:
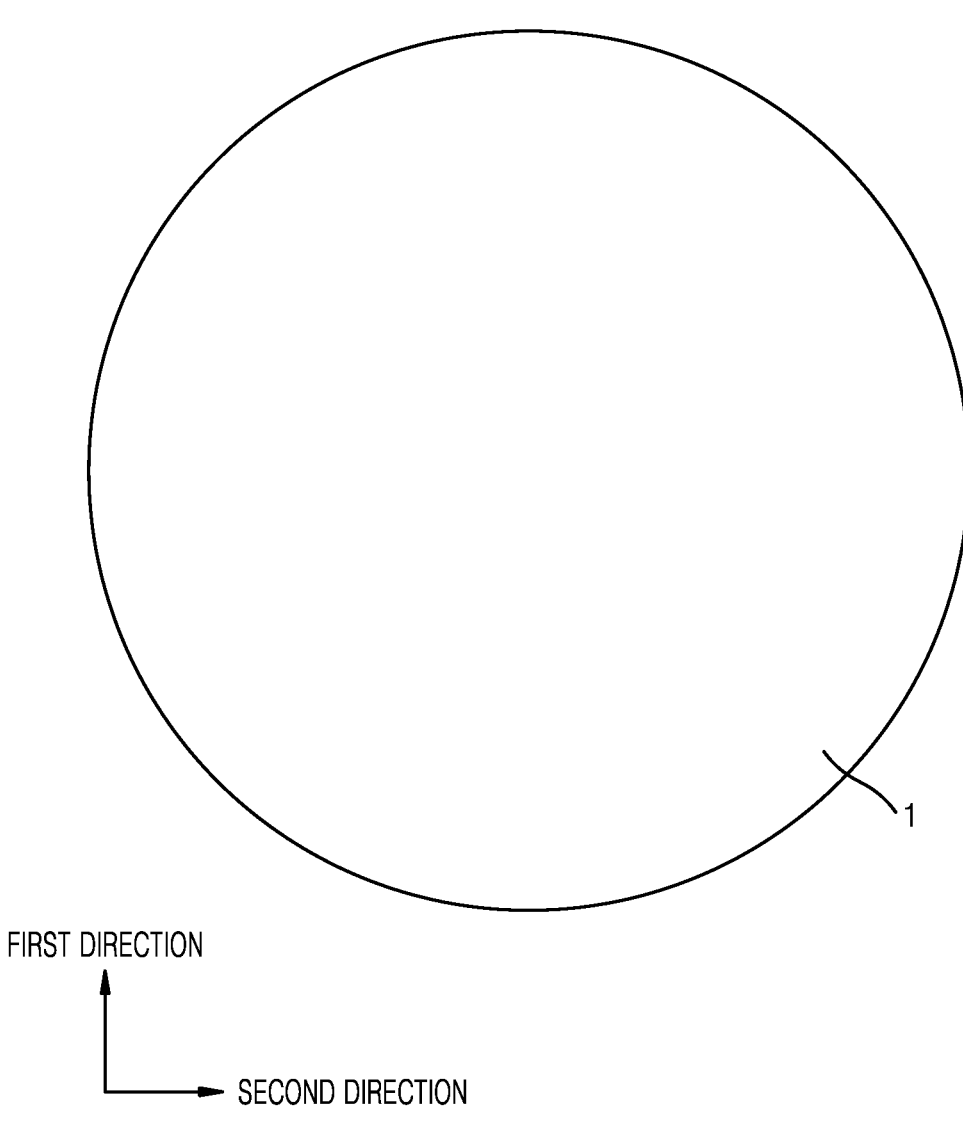
FIGS. 6A to 6H illustrate an example of a process of manufacturing the SQUIDs described with reference to FIGS. 1 to 4 in a one-step fabrication method, according to one or more embodiments.

Referring to FIG. 6A, first, a substrate 1 is prepared. The substrate 1 may be a silicon substrate, e.g. a wafer, but embodiment are not limited thereto. Various materials capable of manufacturing the SQUID 10 through a semiconductor process may be used as the substrate 1.

Figure 6B:
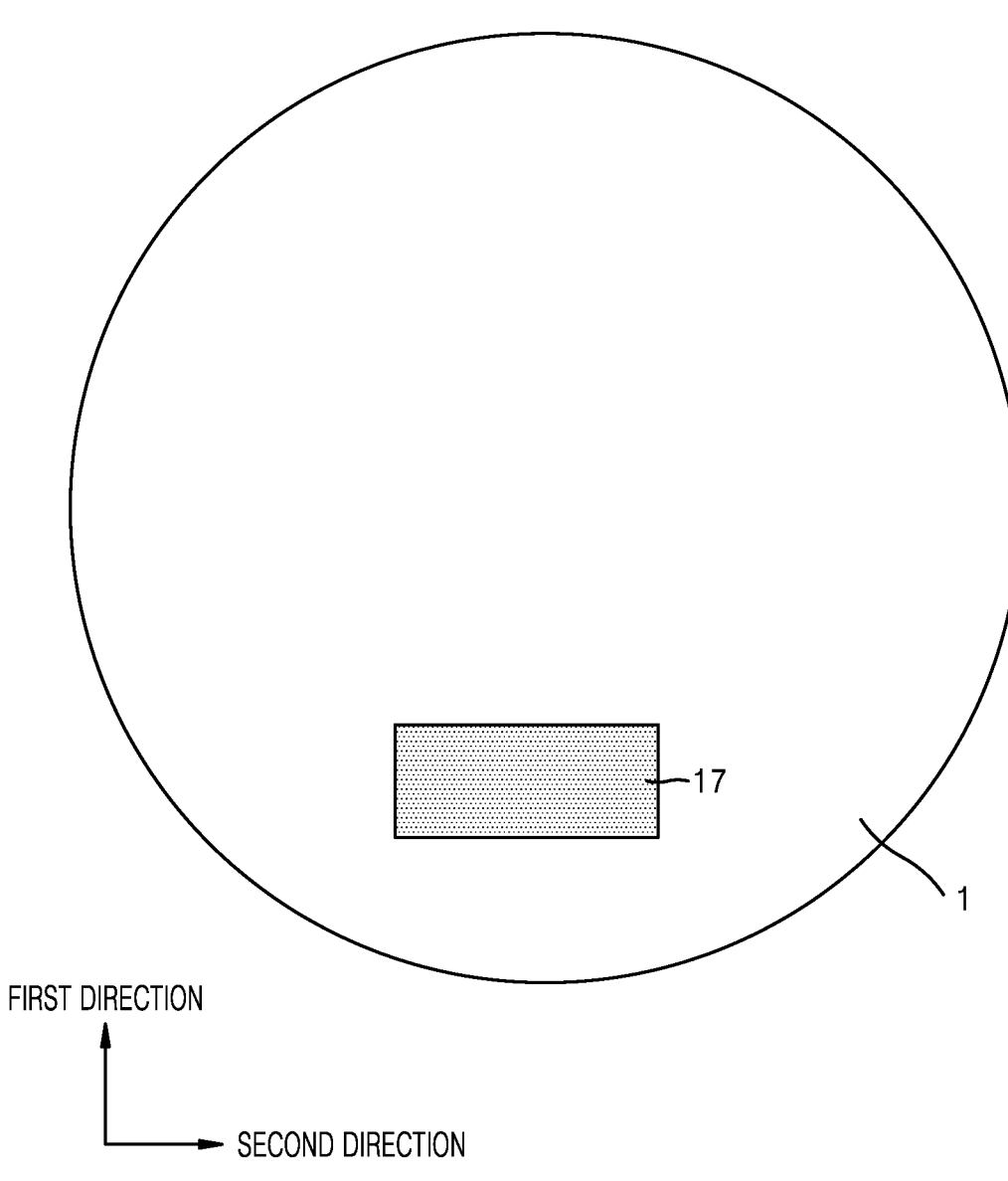

Referring to FIG. 6B, a conductive material region 17 is formed on a partial region of the substrate 1 where the proximity Josephson junction 15 is to be formed. The conductive material region 17 may be formed of a conductive material corresponding to a non-superconductor, for example, a material capable of being deposited as a single layer. The conductive material region 17 may be formed of, for example, graphene, a two-dimensional material, or TMDC. Also, the conductive material region 17 may be formed of, for example, a semiconductor material or a metal material.

Figure 6C:
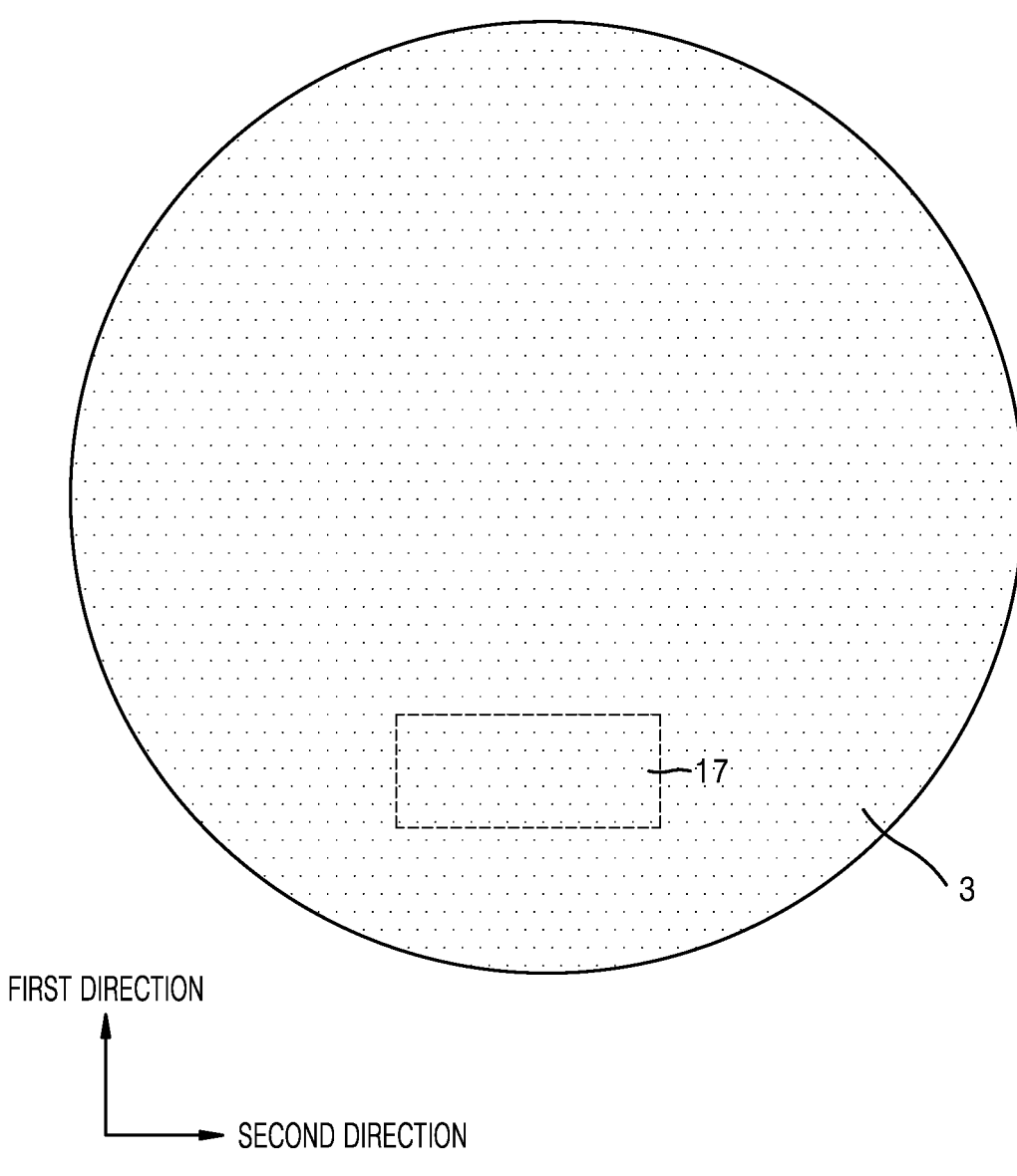
Figure 6D:
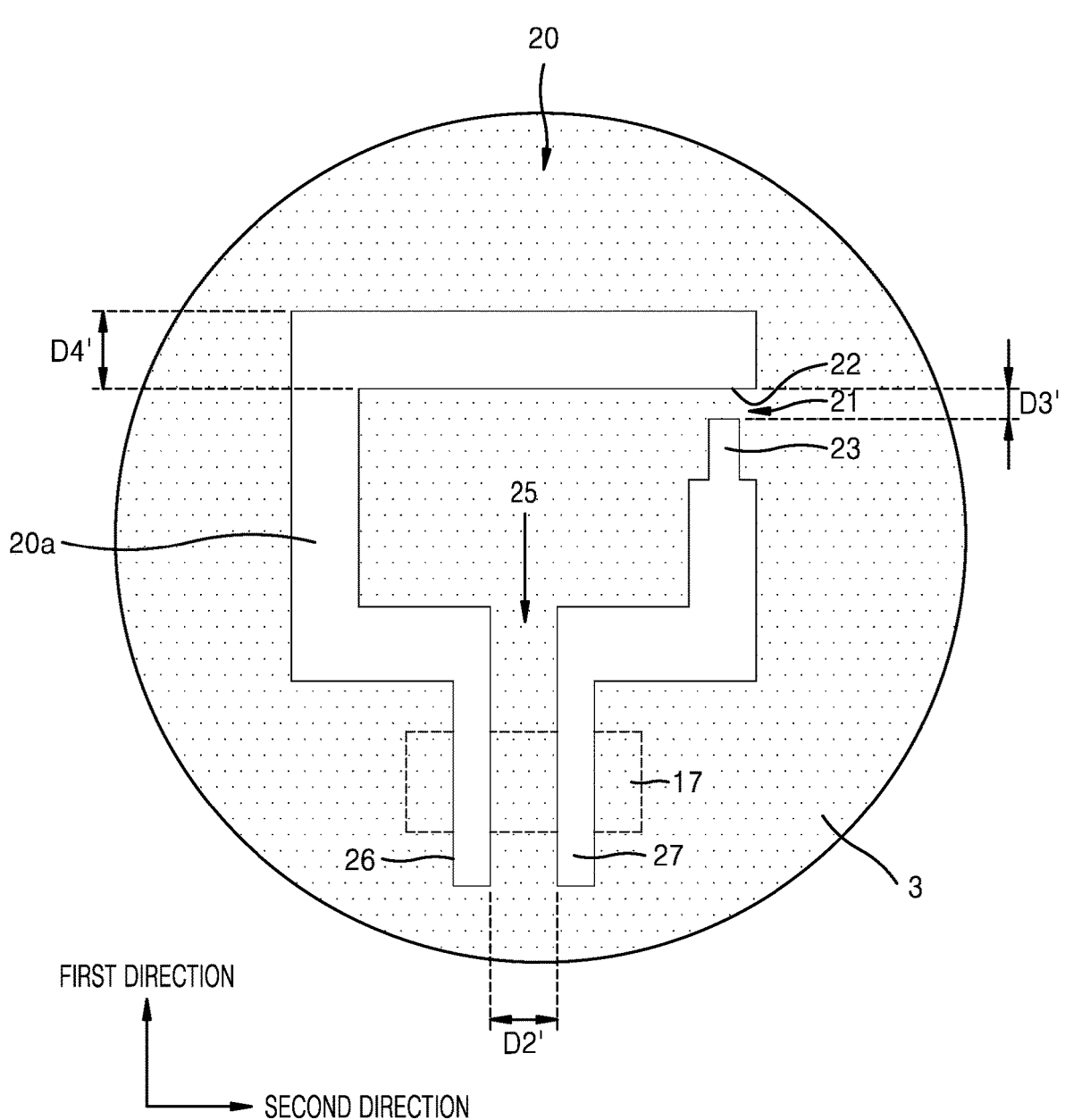

Referring to FIGS. 6C and 6D, a resist layer 3 is coated on the substrate 1 on which the conductive material region 17 is formed to have a loop-like pattern structure 20 of exposed substrate 1. The resist layer 3 may be coated to a sufficient thickness so that a tilting masking using E-beam lithography is possible. In addition, the resist layer 3, for example, may be formed with a hybrid double-layer coating so that a lower layer is sufficiently undercut and an upper layer is finely patterned.

By using the resist layer 3 having a double layer structure, electrode nodes at both ends of the proximity Josephson junction 15 and the tunnel Josephson junction 11 having superconducting electrodes at both ends may be connected in one resist process, and accordingly, a SQUID having Josephson junctions of different types yet connected to each other may be manufactured.

The resist layer 3 may be configured by, for example, E-beam exposure, to form the loop-like pattern structure 20 of exposed substrate 1.

The pattern structure 20 of the resist layer 3 may correspond to, for example, the structure of the first superconducting material layer 30. That is, the pattern structure 20 of the resist layer 3 may include a loop pattern 20a formed of exposed substrate 1 in a shape corresponding to the first loop 30a of the first superconducting material layer 30, and may include a first separation structure pattern 21 including end units spaced apart from each other in a first portion of the loop pattern 20a, a second separation structure 25 including end units spaced apart from each other in a second portion of the loop pattern 20a, and first and second extension patterns 26 and 27 extending in a direction different from the second direction from the second separation structure pattern 25, for example, in the first direction and facing each other.

The first separation structure pattern 21 is for forming the tunnel Josephson junction 11, and may be formed by an E-beam exposure to leave only electrodes perpendicular to each other when masking and to configure an area from which a critical current value sufficiently greater than that of the proximity Josephson junction 15 may be realized.

In addition, in a portion of the second separation structure pattern 25 for forming the proximity Josephson junction 15, a process for a contact, such as Ar-milling, may be selectively performed for a contact of the proximity Josephson junction 15.

The first separation structure pattern 21 corresponds to the first separation structure 31 of the first superconducting material layer 30, and may be formed to include a first end unit 23 and a second end unit 22 spaced apart from each other by a first separation distance D3' in the first direction in the first portion of the loop pattern 20a. The first separation distance D3' of the first separation structure pattern 21 is less than the first distance D1 and may be less than a width D4' of the loop pattern 20a in the first direction. The width D4' of the loop pattern 20a in the first direction may correspond to the width D4 of the first loop 30a of the first superconducting material layer 30 to be formed later. Here, a corresponding width may include the same width or different width, and the widths of the first superconducting material layer 30 and the second superconducting material layer 50 formed by a deposition process with respect to the pattern structure 20 of the resist layer 3 may be the same as or different from the width of the pattern structure 20.

The second separation structure pattern 25 corresponds to the second separation structure 35 of the first superconducting material layer 30, and may be formed to include a third end unit and a fourth end unit spaced apart from each other by a second separation distance D2' in the second direction in the second region of the loop pattern 20a. The first and second extension patterns 26 and 27 may extend from the third and fourth end units of the second separation structure pattern 25 in a direction different from the second direction, for example, in the first direction. The first and second extension patterns 26 and 27 may extend from the third and fourth end units of the second separation structure pattern 25, for example, in the –first direction. The first and second extension patterns 26 and 27 may be formed to expose portions of the conductive material region 17 corresponding to the first and second extension patterns 26 and 27.

On the other hand, in the case of using the resist layer 3 having a double-layer structure, the pattern structure 20 of the resist layer 3 may be formed to include, for example, a plurality of layers having different opening widths, for example, a double-layer structure. For example, a width of an opening of a lower layer of the pattern structure 20 may be greater than a width of an opening of an upper layer. A width of the pattern structure 20 shown in FIG. 6D may correspond to the width of the opening formed in the upper layer of the resist layer 3.

Figure 6E:
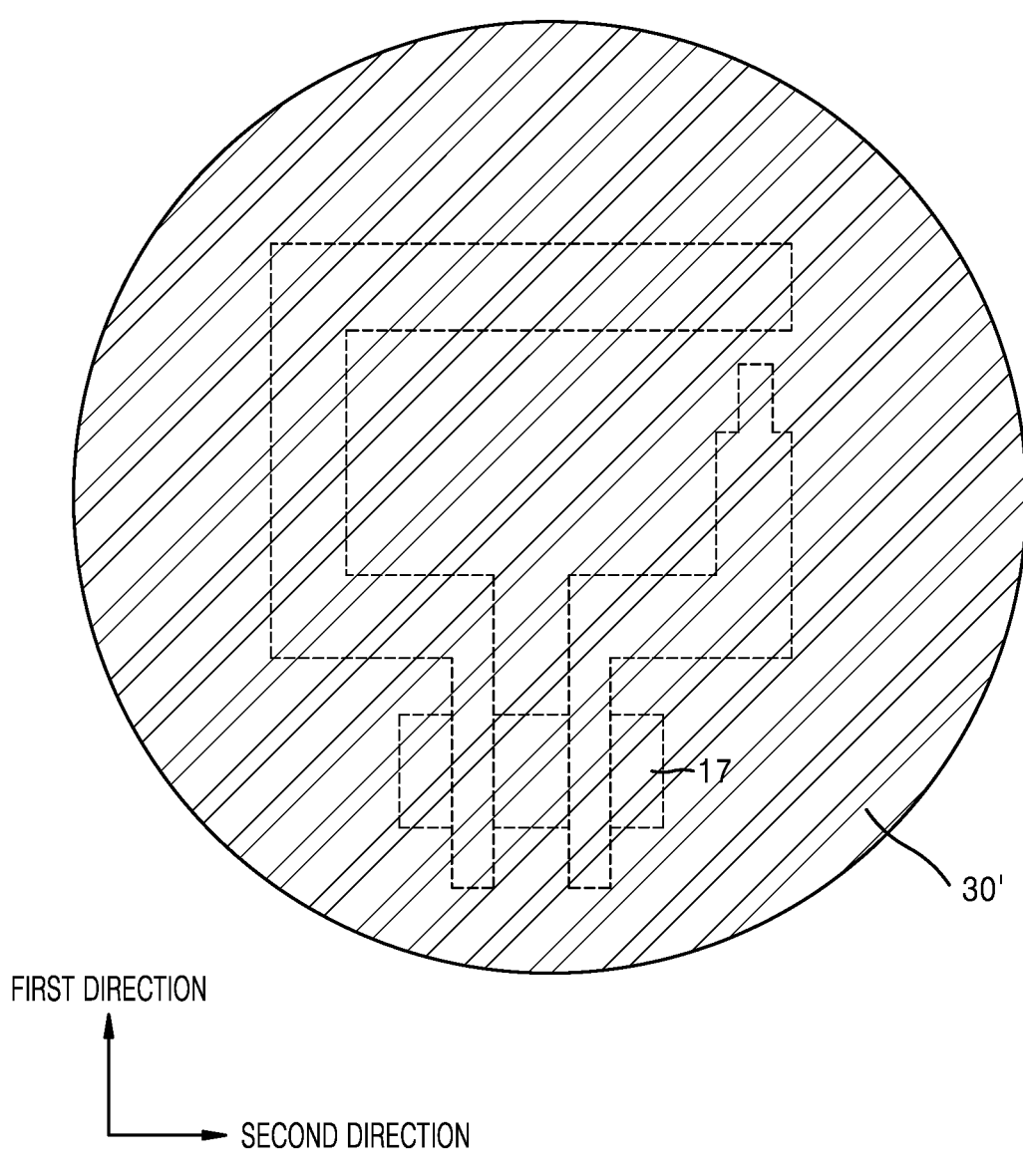
Figure 6F:
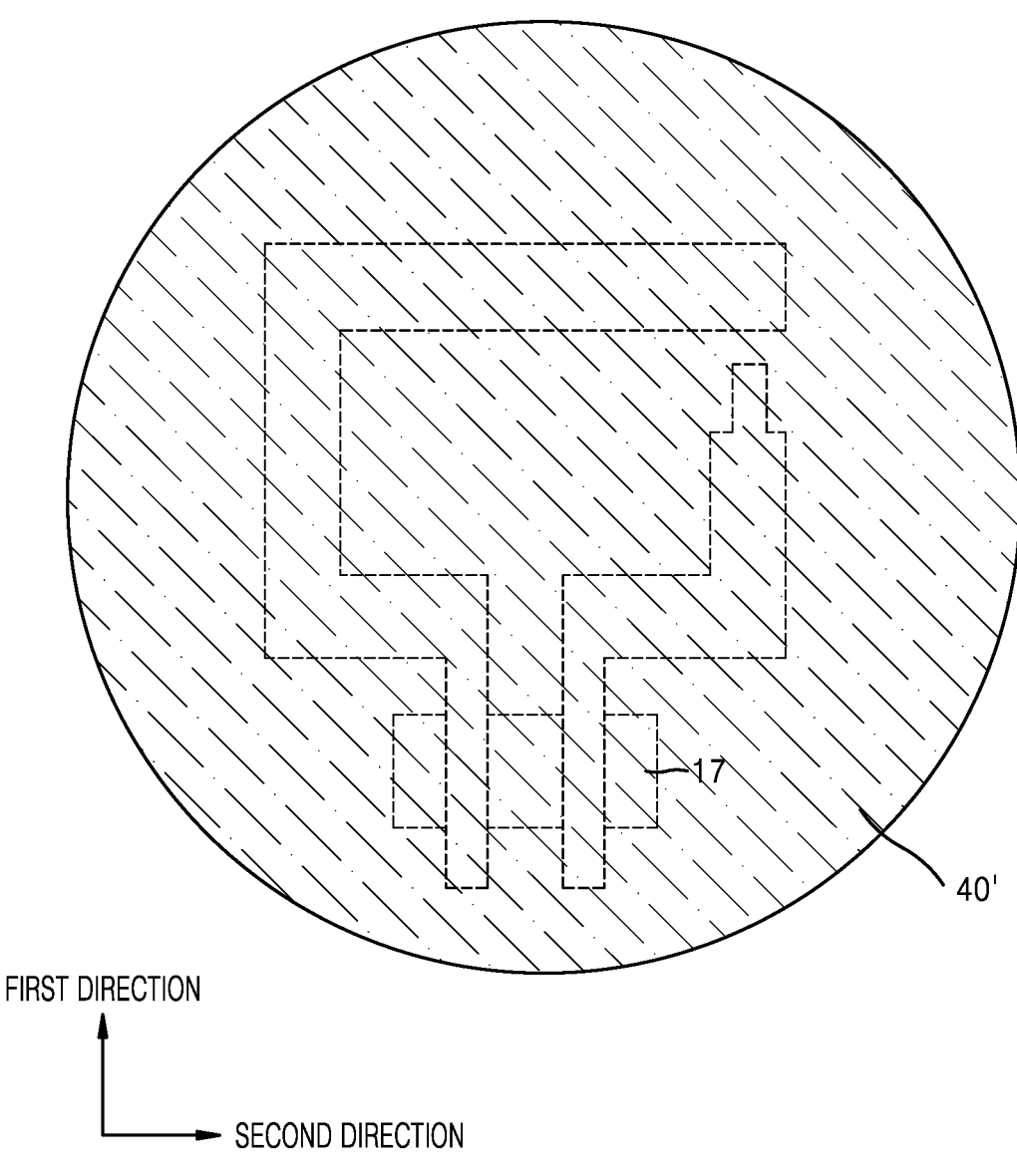

In this way, after forming the pattern structure 20 exposing the substrate 1 with a structure corresponding to the first superconducting material layer 30 on the resist layer 3, as shown in FIGS. 6E and 6F, a base material layer 30' (for forming the first superconducting material layer 30 and an oxide layer 40' for forming the tunnel thin film layer 40) may be formed by using a deposition process with respect to the pattern structure 20.

Referring to FIG. 6E, in order to form the first superconducting material layer 30, first, a base material of the first superconducting material layer 30 may be deposited. In FIG. 6E, reference numeral 30' denotes a base material layer deposited to form the first superconducting material layer 30. The deposition of the base material layer 30' may be performed without tilting or adjusting a rotation angle of the substrate 1.

Next, referring to FIG. 6F, the tunnel thin film layer 40 may be formed by oxidizing a partial thickness of the deposited base material to form the first superconducting material layer 30. The base material layer 30' may include, for example, a superconducting material. In FIG. 6F, reference numeral 40' denotes an oxide layer obtained by oxidizing a partial thickness of the base material layer 30' for forming the first superconducting material layer 30 to form the tunnel thin film layer 40. In this way, when the oxide layer 40' for forming the tunnel thin film layer 40 is formed by oxidizing a partial thickness of the base material layer 30', the oxide layer 40' may be formed of an oxide of a superconducting material. For example, when the base material layer 30' includes aluminum, the oxide layer 40' for forming the tunnel thin film layer 40 may include aluminum oxide. As another example, instead of oxidizing a partial thickness of the base material layer 30' for forming the first superconducting material layer 30, the oxide layer 40' for forming the tunnel thin film layer 40 may be formed separately. Even in this case, the oxide layer 40' may be formed of, for example, an oxide of a superconducting material. The oxide layer 40' formed in this way may entirely cover a base material layer 30' for forming the first superconducting material layer 30. Hereinafter, as an example, a case in which a thin tunnel layer 40 is formed by oxidizing a partial thickness of a base material for forming the first superconducting material layer 30 will be described.

Figure 6G:
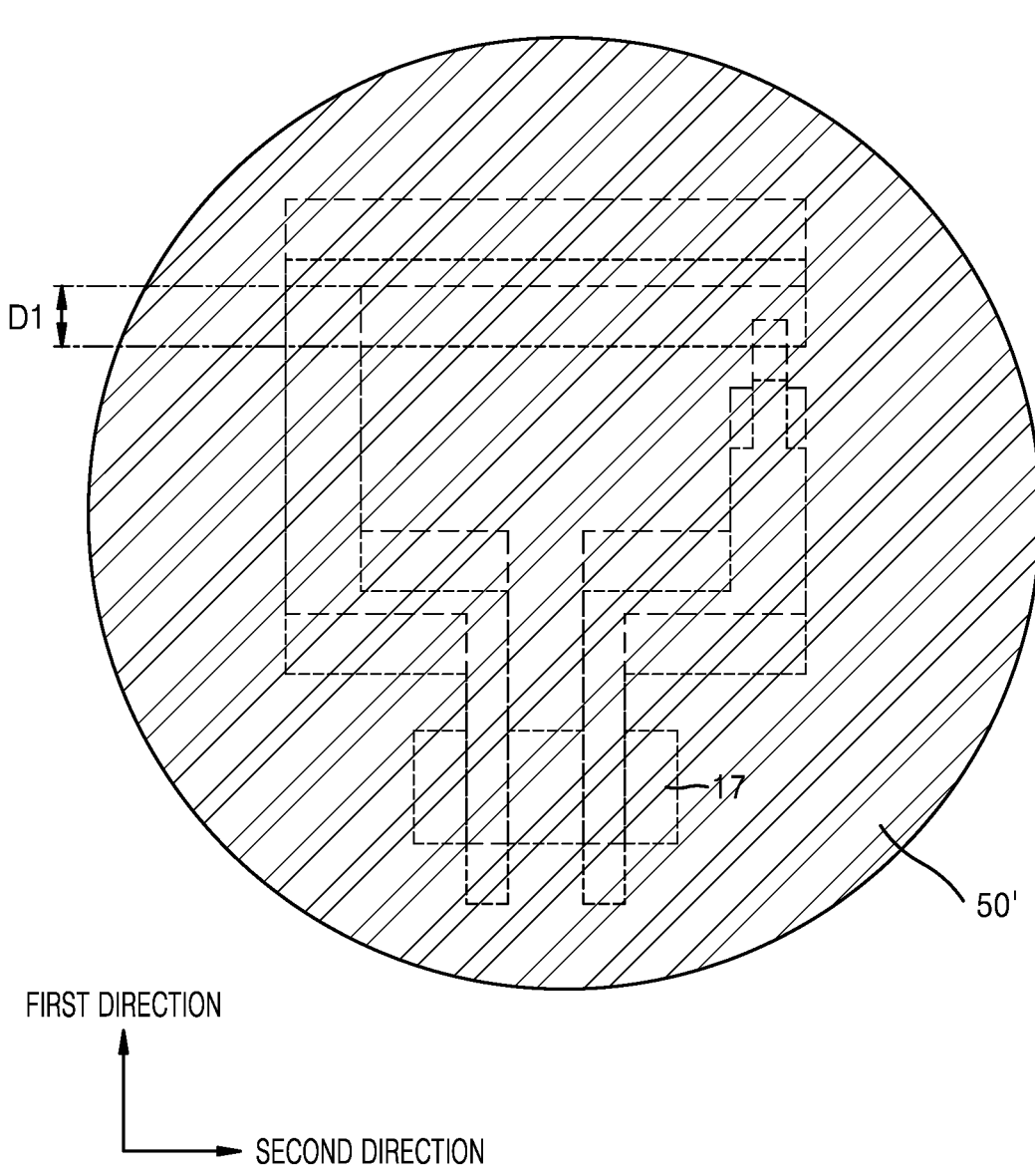

Next, referring to FIG. 6G, a base material layer 50' for forming the superconducting material layer 50 (shifted by the first width D1 in the first direction with respect to the pattern structure 20) may be deposited by utilizing a tilt angle of the substrate 1 on the oxide layer 40'. The tilt angle of the substrate 1 may be an angle sufficient for masking with a mask formed of the pattern structure 20 of the resist layer 3 during deposition of the base material layer 50'.

In this way, when the base material layer 50' is deposited, as the substrate 1 is tilted, the second superconducting material layer 50 may be shifted with respect to the first superconducting material layer 30 for example, by the pattern structure 20 of the resist layer 3 having a double layer structure.

Figure 6H:
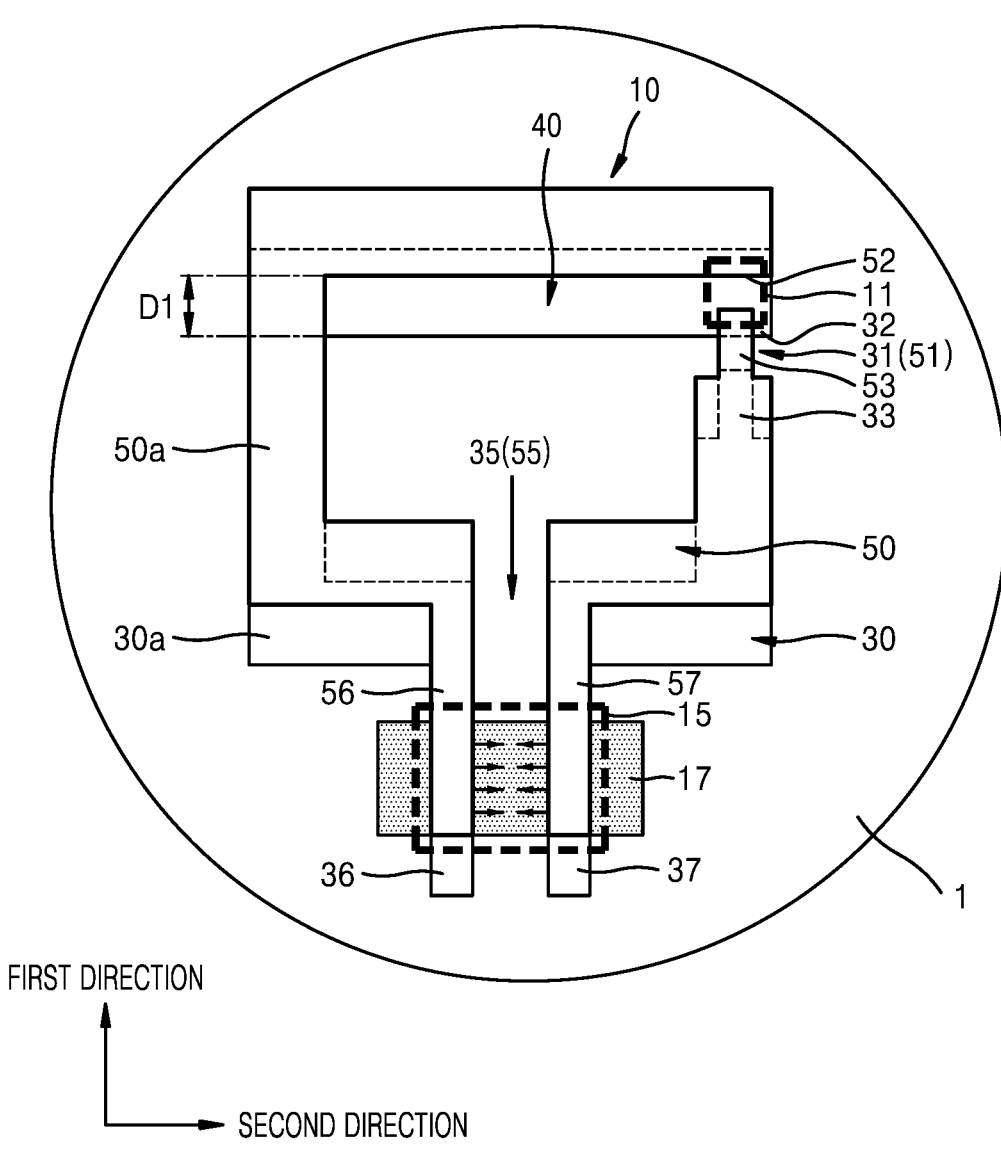

Next, referring to FIG. 6H, when the resist layer 3 is removed by using a lift-off process, the first superconducting material layer 30 and the second superconducting material layer 50 may each have a shape corresponding to the pattern structure 20, and the SQUID 10 having a stack structure in which the second superconducting material layer 50 is shifted by a first width D1 in a first direction with respect to the first superconducting material layer 30 may be obtained. FIG. 6H shows an example in which the SQUID 10 having the structure shown in FIG. 1 is manufactured on the substrate 1.

When depositing the base material layer 50', a direction and angle of inclination of the substrate 1 may be determined so that the second superconducting material layer 50 is shifted in a direction in which at least a portion of first end unit 53 of the second superconducting material layer 50 overlaps the second end unit 32 of the first superconducting material layer 30. As a result, the first end unit 53 of the second superconducting material layer 50, the tunnel thin film layer 40 on the second end unit 32 of the first superconducting material layer 30, and the second end unit 52 of the second superconducting material layer 50 may form a tunnel Josephson junction 11.

The shift of the second superconducting material layer 50 according to the inclination of the substrate 1 may be determined by a shape of an electrode forming the proximity Josephson junction 15, that is, in consideration of the conductive material region 17 and an arrangement shape of the first and second extension units 36 and 37, and shapes of the first end unit 53 of the second superconducting material layer 50 and the second end unit 52 are also determined according to the shift direction.

For example, as shown as an example in FIGS. 1 and 2, when an electrode forming the proximity Josephson junction 15 is disposed in the second direction (horizontal axis) and the shift is performed in the second direction, the first and second extension units 56 and 57 are shifted in the second direction, and thus, electrodes unnecessary in the proximity Josephson junction 15 may be formed. To prevent this, the shift may be performed in the first direction, and accordingly, the tunnel Josephson junction 11 may be formed in the first direction.

The tunnel thin film layer 40 may entirely cover the first superconducting material layer 30. In addition, the (i) shift direction of the second superconducting material layer 50 with respect to the first superconducting material layer 30 and the (ii) extension direction of the first and second extension units 36 and 37 of the first superconducting material layer 30 may be opposite directions.

Accordingly, at the conductive material region 17, the proximity Josephson junction 15 is formed by a stacked structure of the first and second extension units 36 and 37 of the first superconducting material layer 30 and the conductive material region 17, respectively. In addition, at the first separation structure 51 of the second superconducting material layer 50, a part of the first end unit 53 of the second superconducting material layer 50 overlaps the second unit 52 of the first superconducting material layer 30, and thus, the tunnel Josephson junction 11 including the first end unit 53 of the second superconducting material layer 50, the tunnel thin film layer 40, and the second end unit 52 of the second superconducting material layer 50 may be formed. Because at least some regions of the first loop 30*a* and the second loop 50*a* overlap, a superconducting loop may be formed by forming a Josephson junction between the first loop 30*a* and the second loop 50*a*. Accordingly, the SQUID 10 in which the proximity Josephson junction 15 and the tunnel Josephson junction 11 are connected through a superconducting loop may be obtained. The manufacturing process of FIGS. 6A to 6H may be applied to manufacture the SQUID 10 and the SQUID 100, or to manufacture various modified examples of SQUIDs by changing the pattern structure 20.

Figure 7:
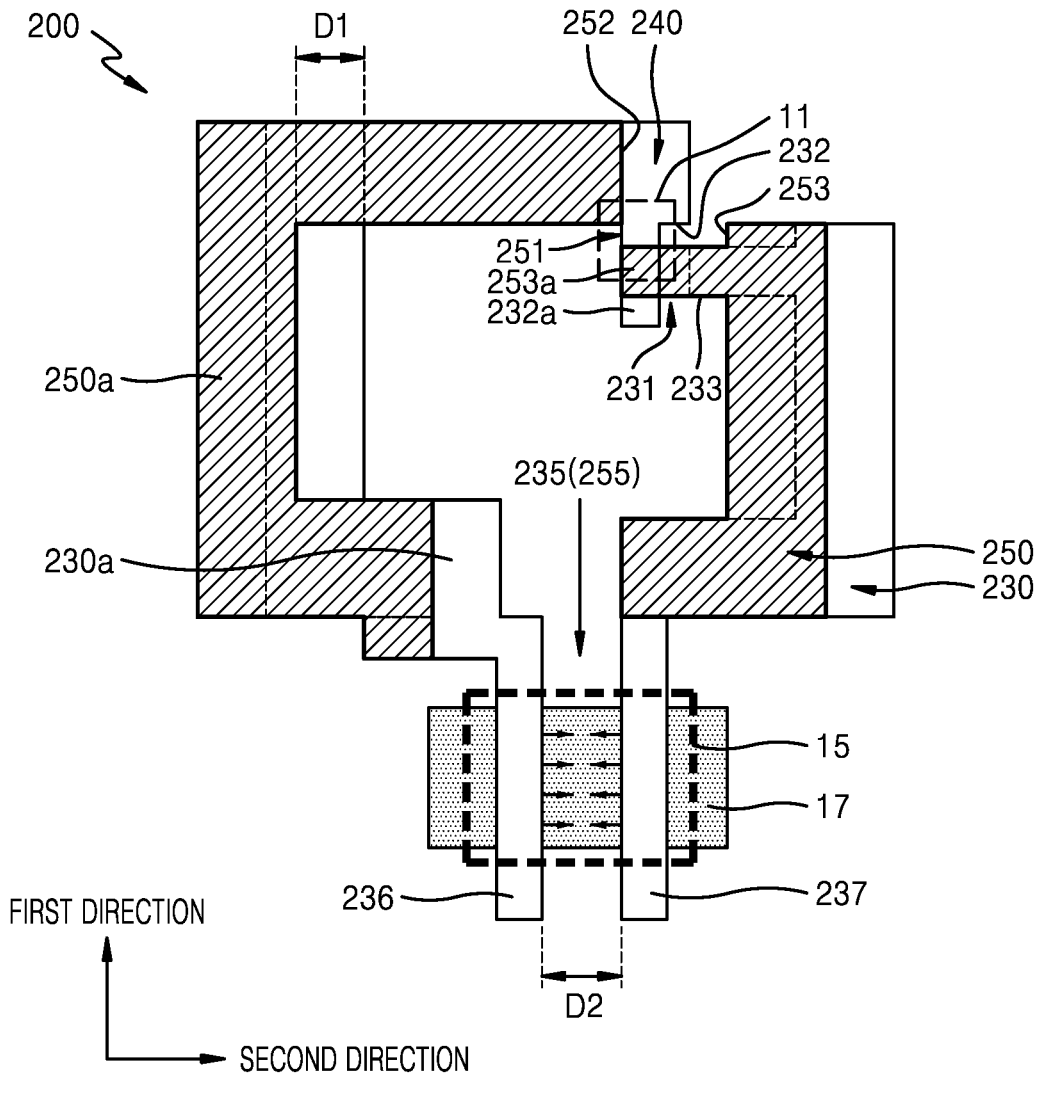
FIG. 7 shows a SQUID, according to one or more embodiments.

FIG. 7 shows a SQUID 200 according to another embodiment. When compared to the SQUIDs 10 and 100, there is a difference in that a shift direction of a second superconducting material layer 250 with respect to a first superconducting material layer 230 (for forming a tunnel Josephson junction) and an extension direction of first and second extension units 236 and 237 (for forming a proximity Josephson junction) form a predetermined angle, for example, a cross. In FIG. 7 and FIGS. 8A to 8H as described below, the same or similar configuration as the SQUIDs 10 and 100 described with reference to FIGS. 1 to 5 and the manufacturing method described with reference to FIGS. 6A to 6H use the same reference numerals and repetitive explanations are somewhat omitted.

In FIG. 7, the distances D1 and D2 are used for convenience of description and to not imply that the distances are the same as in the SQUIDs 10 and 100; the physical dimensions of the SQUID 200, such as the shifting first width and second separation distance, may vary depending on design conditions etc.

In addition, FIG. 7 show an example in which the SQUID 200 according to an embodiment, like the SQUID 10, is provided to form one proximity Josephson junction 15 and one tunnel Josephson junction 11, but embodiments are not limited thereto. For example, the SQUID 200 according to an embodiment, like the SQUID 100, may be formed with one proximity Josephson junction 15 and a plurality of tunnel Josephson junctions 11.

Referring to FIG. 7, the SQUID 200 includes a conductive material region 17, the first superconducting material layer 230, a tunnel thin film layer 240, and the second superconducting material layer 250. The first superconducting material layer 230 forms a first loop 230*a* and includes the first and second extension units 236 and 237 spaced apart from each other. The first and second extension units 236 and 237 may form a stack structure with the conductive material region 17 to form the proximity Josephson junction 15. The second superconducting material layer 250 forms a second loop 250*a* and includes a first separation structure 251 including a first end unit 253 and a second end unit 252 spaced apart from each other. The tunnel thin film layer 240 may be provided to form a stack structure with the first end unit 253 and the second end unit 252 of the first separation structure 251. Accordingly, the first end unit 253 of the second superconducting material layer 250, the tunnel thin film layer 240, and the second end unit 252 of the second superconducting material layer 250 form a tunnel Josephson junction 11.

The conductive material region 17, the first superconducting material layer 230, the tunnel thin film layer 240, and the second superconducting material layer 250 may be stacked on the substrate 1, in that order. In this case, the proximity Josephson junction 15 may be formed between the conductive material region 17 and the first superconducting material layer 230, and the tunnel Josephson junction 11 may be formed between the tunnel thin film layer 240 and the second superconducting material layer 250. As another example, the first superconducting material layer 230, the tunnel thin film layer 240, the second superconducting material layer 250, and the conductive material region 17 may be sequentially stacked on the substrate 1. In this case, the tunnel Josephson junction 11 may be formed between the first superconducting material layer 230 and the tunnel thin film layer 240, and the proximity Josephson junction 15 may be formed between the second superconducting material layer 250 and the conductive material region 17.

For example, when the conductive material region 17, the first superconducting material layer 230, the tunnel thin film layer 240, and the second superconducting material layer 250 are sequentially stacked on the substrate 1, the conductive material region 17 may be formed on a partial region of the substrate 1 to form the proximity Josephson junction 15 by forming a stack structure with the first and second extension units 236 and 237 spaced apart from each other of the first superconducting material layer 230, and the tunnel thin film layer 240 may be formed on at least a partial region of the first superconducting material layer 230 to form a stack structure with the first end unit 253 and the second end unit 252 spaced apart from each other of the second superconducting material layer 250. For example, the tunnel thin film layer 240 may be formed to cover a part or all of the first superconducting material layer 230. As another example, when the second superconducting material layer 250, the tunnel thin film layer 240, the first superconducting material layer 230, and the conductive material region 17 are sequentially stacked on the substrate 1, the tunnel thin film layer 240 may be formed on at least a partial region of the second superconducting material layer 250 to form a stack structure with the first end unit 253 and the second end unit 252. For example, the tunnel thin film layer 240 may be formed to cover a part or all of the second superconducting material layer 250 overlapping the first superconducting material layer 230. The conductive material region 17 may be formed on the second superconducting material layer 250 corresponding to a partial region on the substrate 1 to form the proximity Josephson junction 15 by forming a stack structure with the first and second extension units 236 and 237.

Hereinafter, a case in which the conductive material region 17, the first superconducting material layer 230, the tunnel thin film layer 240, and the second superconducting material layer 250 are sequentially stacked on the substrate 1 will be described as an example, but embodiments are not limited thereto. Modifications according to changes in a stacking order may be made from embodiments described below, and thus, repetitive illustrations and descriptions are omitted.

The conductive material region 17 may be formed on a partial region of the substrate 1 to locationally correspond to the first and second extension units 236 and 237. The conductive material region 17 may be a conductive material corresponding to a non-superconductor, for example, a material capable of being deposited as a single layer. The conductive material region 17 may be formed of, for example, graphene, a two-dimensional material, or TMDC. Also, the conductive material region 17 may be formed of, for example, a semiconductor material or a metal material.

The first superconducting material layer 230 may form a first loop 230a and may include the first and second extension units 236 and 237 and form a stack structure with the conductive material region 17 to form a proximity Josephson junction 15. The first superconducting material layer 230 may include, for example, aluminum or niobium.

The first superconducting material layer 230 may have a second separation structure 235 including a third end unit and a fourth end unit spaced apart by a second distance D2 in a second direction, and the first and second extension units 236 and 237 may extend from the third and fourth end units of the second separation structure 235 in the first direction. The second direction may be a direction parallel to a shift direction of the second superconducting material layer 250 with respect to the first superconducting material layer 230. In addition, for example, the shift direction of the second superconducting material layer 250 with respect to the first superconducting material layer 230 may be a −second direction, and the first and second extension units 236 and 237 may extend in the −first direction in the second separation structure 235 of the first loop 230a. As shown as an example in FIG. 7, the shift direction may be parallel to the second direction, and the first and second extension units 236 and 237 may extend in a direction perpendicular to the second direction and away from the first loop 230a, but embodiments are not limited thereto. For example, the first and second extension units 236 and 237 may extend to the inside of the first loop 230a, in which case the conductive material region 17 may be correspondingly positioned inside the first loop 230a.

The second superconducting material layer 250 may form a second loop 250a and may have the first separation structure 251 that includes the first end unit 253 and the second end unit 252 spaced apart from each other. At least a portion of the second loop 250a may overlap the first loop 230a to form a stack structure. For example, the first loop 230a and the second loop 250a may be provided to have corresponding shapes, and may be provided to form a stack structure in which the second superconducting material layer 250 is shifted by a first distance D1 in the second direction with respect to the first superconducting material layer 230. The second superconducting material layer 250 may be shifted with respect to the first superconducting material layer 230 by the first distance D1, for example, in the −second direction. The second superconducting material layer 250 may include, for example, at least one of aluminum and niobium. The first distance D1 by which the second superconducting material layer 250 is shifted with respect to the first superconducting material layer 230 may be greater than a separation distance between the first end unit 233 and the second end unit 232 of the first superconducting material layer 230 in the second direction and may be less than the width D4 of the first loop 230a of the first superconducting material layer 230 in the second direction.

The second superconducting material layer 250 may be formed, for example, without first and second extension units corresponding to the first and second extension units 236 and 237 of the first superconducting material layer 230.

As shown as an example in FIG. 7, in the SQUID 200 according to an embodiment, since the shift direction of the second superconducting material layer 250 with respect to the first superconducting material layer 230 is perpendicular to an extension direction of the first and second extension units 236 and 237, for example, compared to the first superconducting material layer 230, the second superconducting layer 250 may be formed so that there is no first extension unit, no second extension unit, and no protrusion of the second end unit 252, thereby preventing an uncertain phase slip in the tunnel Josephson junction 11 and the proximity Josephson junction 15.

For example, the first superconducting material layer 230 may form the first loop 230a and may include the first extension unit 236 and the second extension unit 237. The second superconducting material layer 250 may form the second loop 250a and may include a structure excluding the first extension unit and the second extension unit facing each other are excluded. For example, the conductive material region 17 may form a stack structure with the first extension unit 236 and the second extension unit 237 of the first superconducting material layer 230.

The first superconducting material layer 230 may include a first separation structure 231 including a first end unit 233 and a second end unit 232 spaced apart from each other in a second direction in a first region of the first loop 230a and a second separation structure 235 including a third end unit and a fourth end unit spaced apart from each other in a second region of a first loop. The first end unit 233 includes a protrusion extending in the second direction at a retracted position, the second end unit 232 includes a protrusion 232a extending in the first direction at the retracted position, and thus the protrusion of the first end unit 233 and the protrusion 232a of the second end unit 232 may extend in a direction perpendicular to each other and may be spaced apart from each other in the second direction. The first and second extension units 236 and 237 may extend from the third end unit and the fourth end unit in a direction different from the second direction, for example in the first direction, and may face each other.

The second superconducting material layer 250 may include a first separation structure 251 including the first end unit 253 and the second end unit 252 spaced apart from each other in the first region of the second loop 250a, and a second separation structure 255 including third and fourth end units spaced apart from each other in the second direction in the second region of the second loop 250a. In the first separation structure 251, the first end unit 253 includes a protrusion 253a extending in the second direction at the retracted position, and the second end unit 252 may be formed in a structure without a protrusion to prevent an uncertain phase slip due to overlapping the protrusion 232a of the second end unit 232 of the first superconducting material layer 230 in the tunnel Josephson junction 11. Accordingly, a protrusion 253a of the first end unit 253 and the second end unit 252 may be spaced apart from each other in the first direction. In the second separation structure 255, the third end unit and the fourth end unit may be formed in a structure without the first extension unit and the second extension unit to prevent an uncertain phase slip due to overlapping the first extension unit 236 and the second extension unit 237 of the first superconducting material layer 230.

As shown as an example in FIG. 7, a stack structure in which the second superconducting material layer 250 is shifted by the first distance D1 in the second direction with respect to the first superconducting material layer 230 may be formed. The shift may be made so that a part of the protrusion 253a of the first end unit 253 of the second superconducting material layer 250 overlaps the protrusion 232a of the second end unit 232 of the first superconducting material layer 230. In this way, a protrusion length of each end unit and the shifted first width D1 in the first separation structure 231 of the first superconducting material layer 230 and the first separation structure 251 of the second superconducting material layer 250 may be determined to form the tunnel Josephson junction 11 by the protrusion 253a of the first end unit 253 of the superconducting material layer 250, the tunnel thin film layer 240, and the second end unit 252 of the second superconducting material layer 250 by overlapping of the protrusion 253a of the first end unit 253 of the second superconducting material layer 250 with the protrusion 232a of the second end unit 232 of the first superconducting material layer 230.

The tunnel thin film layer 240 may be provided to form the tunnel Josephson junction 11 in the first separation structure 251 of the second superconducting material layer 250. The tunnel thin film layer 240, for example, may be provided to form a stack structure with the protrusion 253a of the first end unit 253 and the second end unit 252 of the first separation structure 251 of the second superconducting material layer 250, and thus, the tunnel Josephson junction 11 including the protrusion 253a of the first end unit 253 of the second superconducting material layer 250, the tunnel thin film layer 240, and the second end unit 252 of the second superconducting material layer 250 may be formed. In addition, the tunnel thin film layer 240 may be provided to cover at least a part or all of the first loop 230a of the first superconducting material layer 230, and thus, a Josephson junction may be formed between the first loop 230a and the second loop 250a, at least a portion of which form a stack structure.

The tunnel thin film layer 240 may be formed of, for example, an oxide of a superconducting material. For example, the tunnel thin film layer 240 may be formed by oxidizing a partial thickness of the first superconducting material layer 230. The first superconducting material layer 230 may include, for example, aluminum, and in this case, the tunnel thin film layer 240 may be formed of aluminum oxide.

Meanwhile, as shown in FIG. 7, the first end unit 253 of the second superconducting material layer 250 in the first separation structure 251 may include one protrusion 253a. In this case, the SQUID 200 according to an embodiment may include one proximity Josephson junction 15 and one tunnel Josephson junction 11. As another example, the first end unit 253 of the second superconducting material layer 250 in the first separation structure 251 may include a plurality of protrusions 253a, for example, two protrusions. In this case, the SQUID 200 according to an embodiment may include one proximity Josephson junction 15 and a plurality of tunnel Josephson junctions 11, for example, two tunnel Josephson junctions 11. The number of tunnel Josephson junctions 11 may vary depending on the number of protrusions formed on the first end unit 253 of the second superconducting material layer 250.

As such, for the SQUID 200, the shift direction of the second superconducting material layer 250 with respect to the first superconducting material layer 230 and the extension direction of the first and second extension units 236 and 237 may cross each other.

FIGS. 8A to 8F are schematic diagrams showing an example of a process of manufacturing a SQUID 200 according to an embodiment described with reference to FIG. 7 in a one-step fabrication method. Here, as described above, the one-step fabrication method means that a resist process may be applied only once to fabricate a device, and does not mean that the entire process is performed in only one step. FIGS. 8A to 8F illustrate a process of manufacturing the SQUID 200 having the structure shown in FIG. 7, but the embodiment is not limited thereto. The manufacturing process of FIGS. 8A to 8H may be applied to manufacturing SQUIDs of various modifications in which the direction of shifting the second superconducting material layer 250 with respect to the first superconducting material layer 230 and the extension direction of the first and second extension units 236 and 237 that form the proximity Josephson junction 15 are different from each other as described with reference to FIG. 7.

Figure 8A:
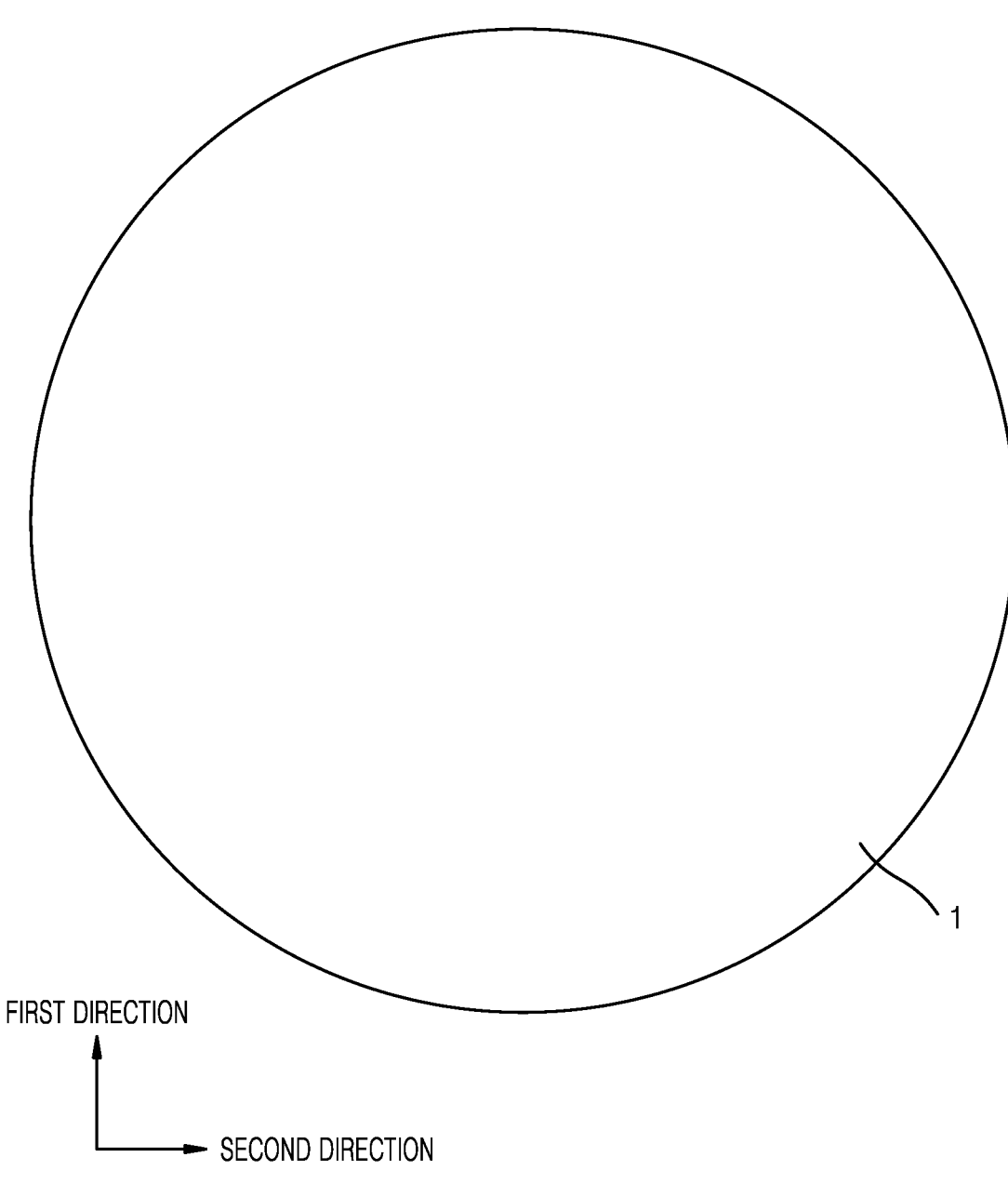
FIGS. 8A to 8H show an example of a process of manufacturing the SQUID of FIG. 7 in a one-step fabrication method, according to one or more embodiments.

Referring to FIG. 8A, first, a substrate 1 is prepared. The substrate 1 may include a silicon substrate, but embodiments are not limited thereto. Substrates of various materials capable of manufacturing the SQUID 200 through a semiconductor process may be used as the substrate 1.

Figure 8B:
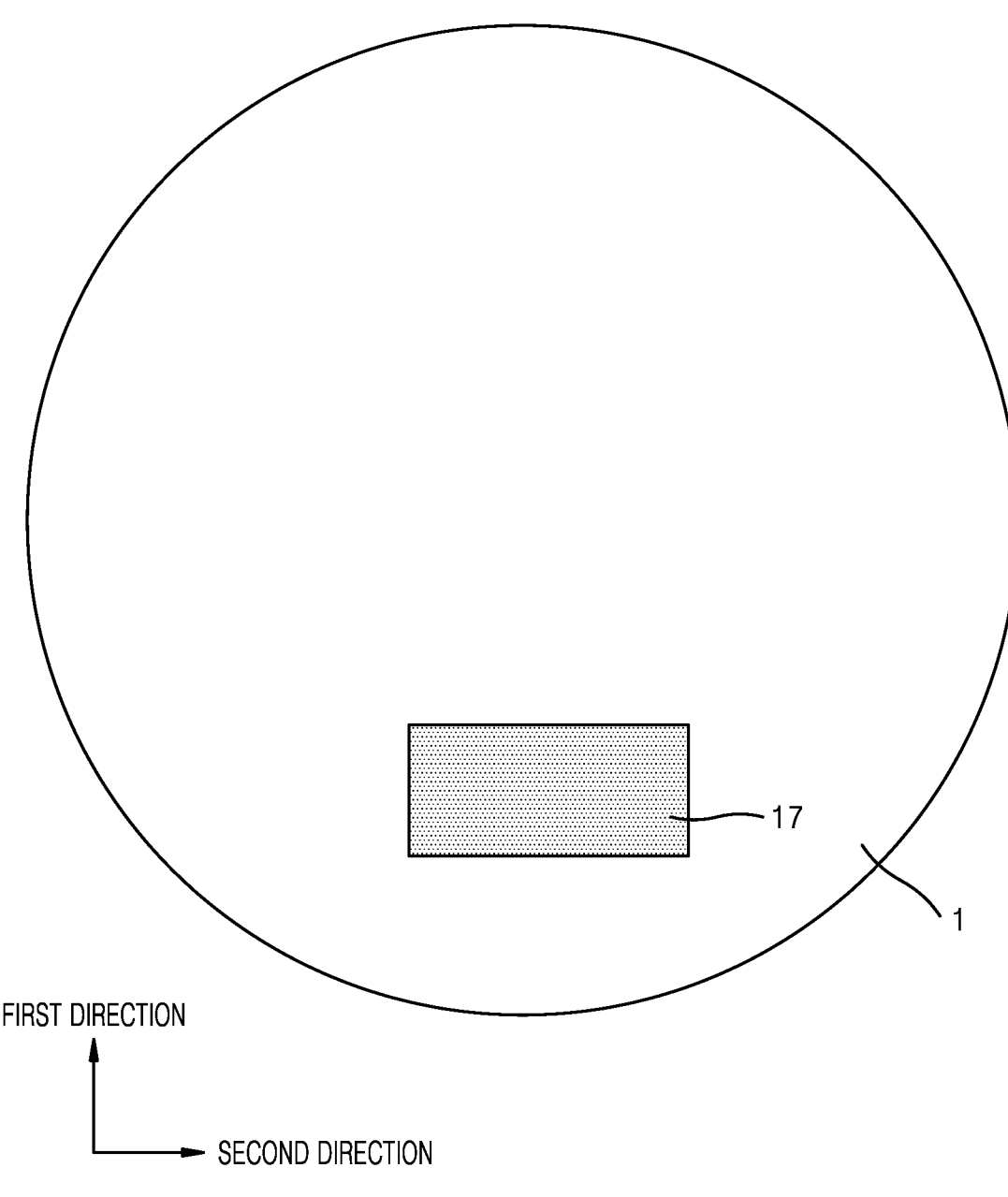

Referring to FIG. 8B, a conductive material region 17 is formed on a partial region of the substrate 1, for example, a region where the proximity Josephson junction 15 is to be formed. The conductive material region 17 may be formed of a conductive material that is a non-superconductor, for example, a material capable of being deposited as a single layer. The conductive material region 17 maybe formed of, for example, graphene, a two-dimensional material, or TMDC. Also, the conductive material region 17 maybe formed of, for example, a semiconductor material or a metal material.

Figure 8C:
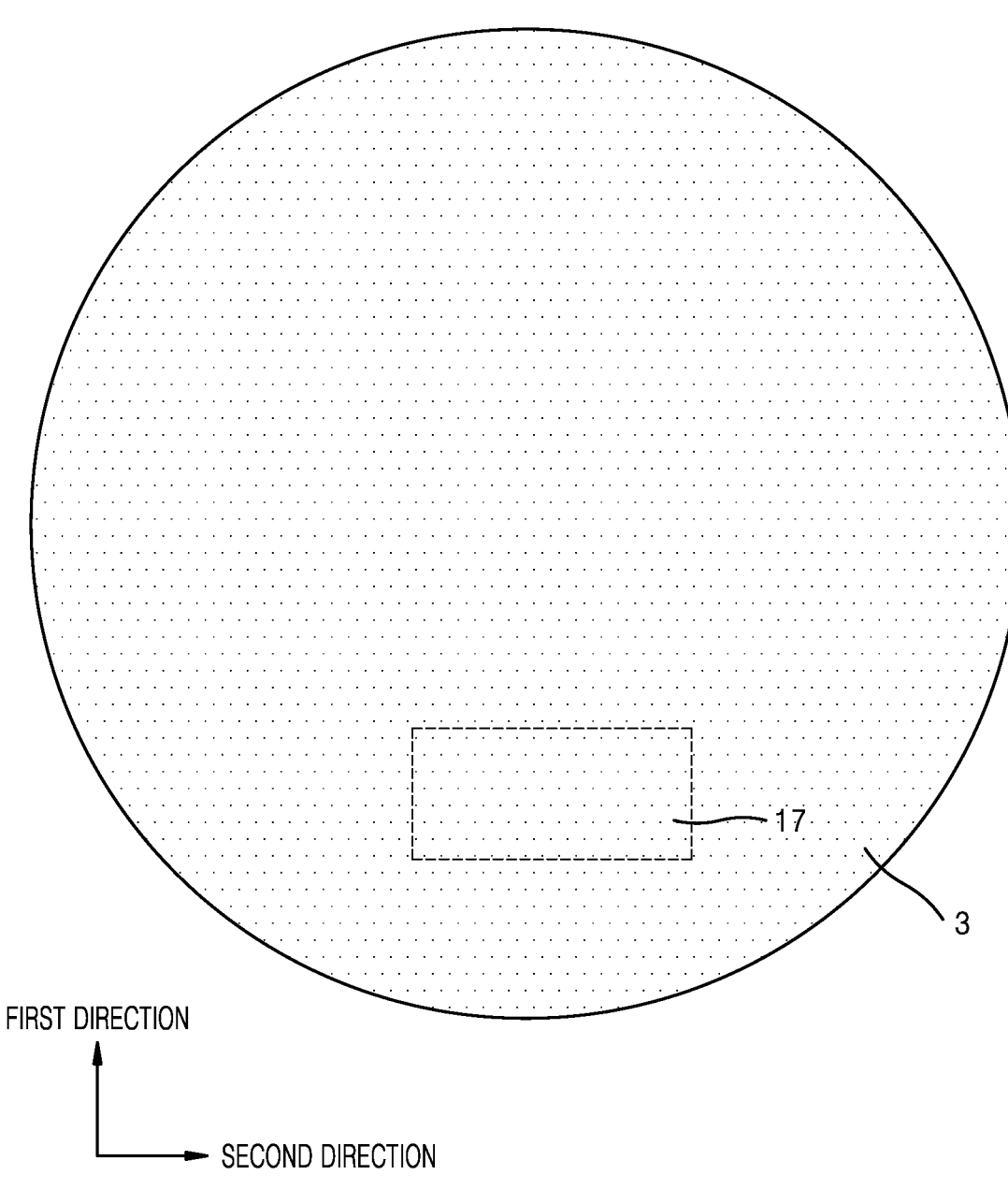
Figure 8D:
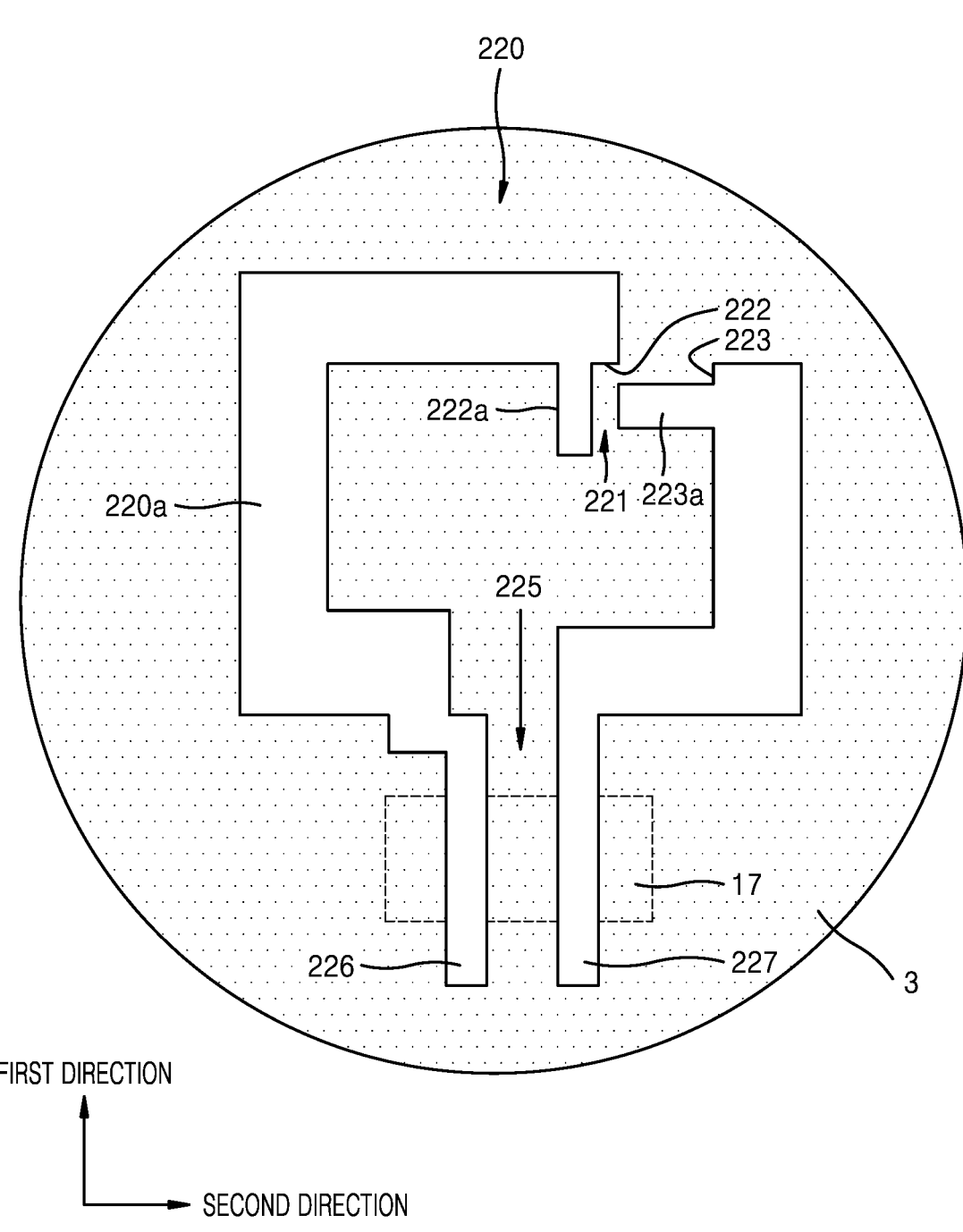

Referring to FIGS. 8C and 8D, a resist layer 3 may be coated on the substrate 1 on which the conductive material region 17 is formed with a pattern structure 220 that exposes a portion of the substrate 1. The pattern structure 220 exposing the substrate 1 may correspond to, for example, the structure of the first superconducting material layer 230. That is, the pattern structure 220 may include a loop pattern 220a formed to expose the substrate 1 in a shape corresponding to the first loop 230a of the first superconducting material layer 230, and a structure including a first separation structure pattern 221 in a first region of the loop pattern 220a, a second separation structure pattern 225 in a second region of the loop pattern 220a, and first and second extension patterns 226 and 227 extending from the second separation structure pattern 225 in a direction different from a second direction, for example, in a direction perpendicular to the second direction and facing each other.

The first separation structure patterns 221 may correspond to the first separation structure 231 of the first superconducting material layer 230, and may be formed to include a first end unit 223 and a second end unit 222 that are spaced apart from each other in a direction perpendicular to each other in a first region of the loop pattern 220a. The first end unit 223 may include a protrusion 223a extending in the second direction at a position retracted in the first direction, the second end unit 222 may include a protrusion 222a extending in the first direction at a position retracted in the second direction, and the protrusion 223a of the first end unit 223 and the protrusion 222a of the second end unit 222 may extend in a direction crossing each other, and may be spaced apart from each other in the second direction. At this time, a separation distance in the second direction of the protrusion 223a of the first end unit 223 and the protrusion 222a of the second end unit 222 may be less than a first distance D1 by which the second superconducting material layer 250 is shifted with respect to the first superconducting material layer 230. A width of the loop pattern 220a in the second direction may correspond to a width of the first loop 230a of the first superconducting material layer 230 to be formed later. Here, the corresponding width includes the same width or different width, and widths of the first superconducting material layer 230 and the second superconducting material layer 250 formed by a deposition process with respect to the pattern structure 220 of the resist layer 3 may be the same or different from the width of the pattern structure 220.

The second separation structure pattern 225 corresponds to the second separation structure 235 of the first superconducting material layer 230, and may be formed to include third and fourth end units spaced apart from each other in the second direction in the second region of the loop pattern 220a. The first and second extension patterns 226 and 227 may be spaced apart from each other, and may extend from the third and fourth end units of the second separation structure pattern 225 in a direction different from the second direction, for example, in the first direction. The first and second extension patterns 226 and 227 may extend from the third and fourth end units of the second separation structure pattern 225, for example, in the –first direction. The first and second extension patterns 226 and 227 may be patterned to expose the conductive material region 17 of the corresponding position.

On the other hand, the pattern structure 220 of the resist layer 3 may include multiple layers having openings with different widths, for example, a double layer structure. For example, a width of an opening of a lower layer of the pattern structure 220 may be greater than that of an opening of an upper layer thereof.

Figure 8E:
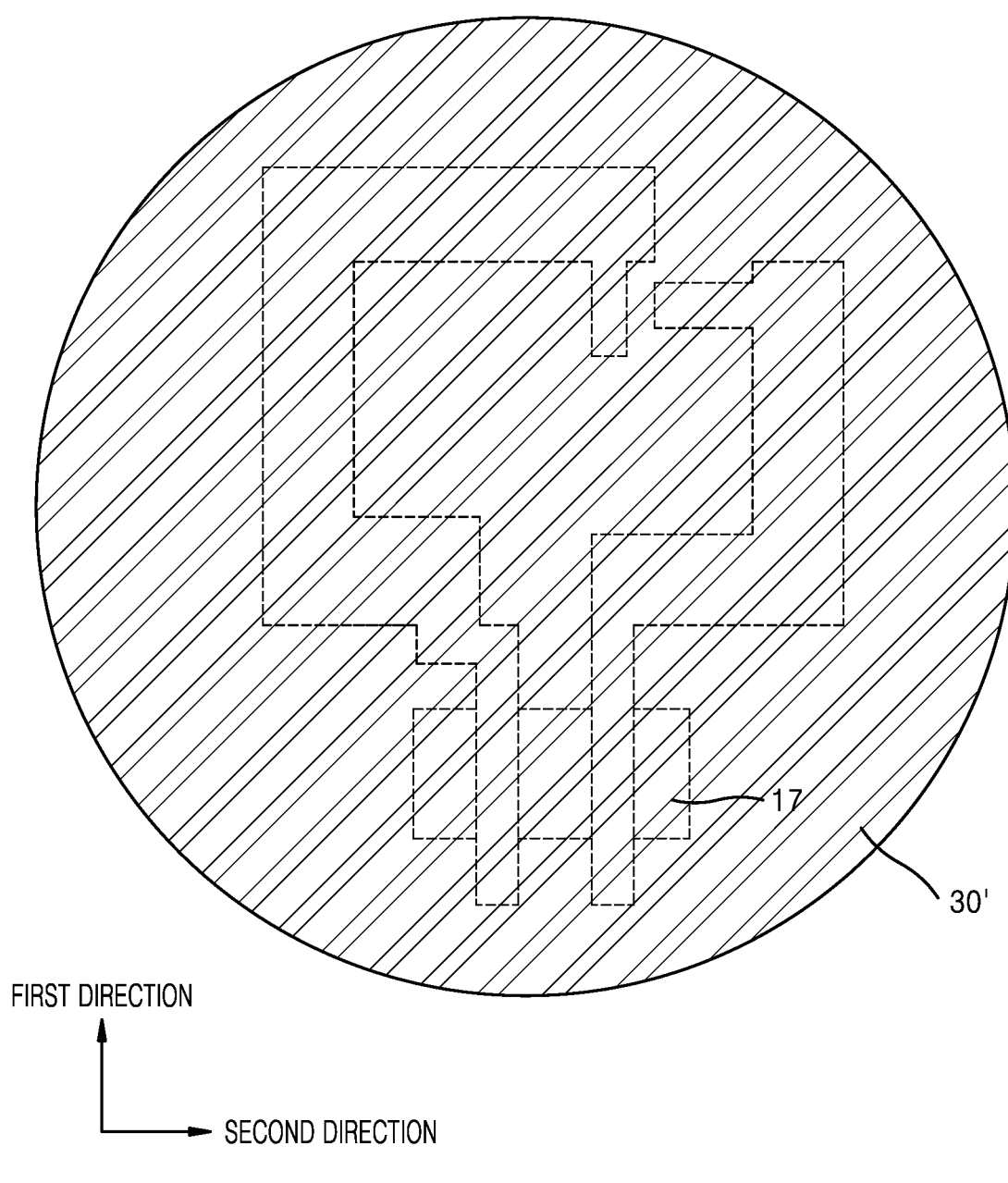
Figure 8F:
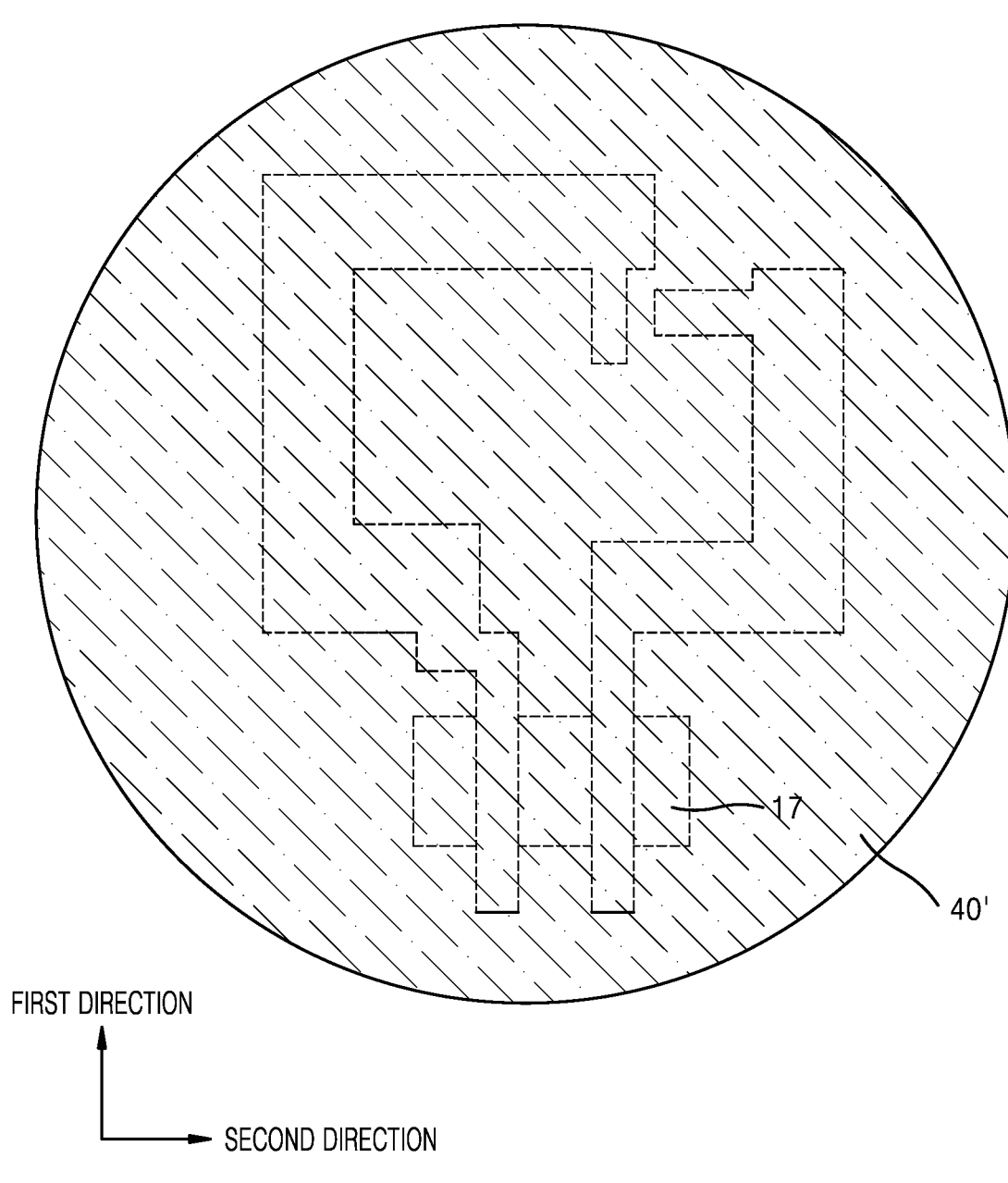

In this way, after forming the pattern structure 220 that exposes the substrate 1 in a structure corresponding to the first superconducting material layer 230 on the resist layer 3, as shown in FIGS. 8E and 8F, a base material layer 30' for forming the first superconducting material layer 230 and an oxide layer 40' for forming the tunnel thin film layer 240 may be formed by using a deposition process with respect to the pattern structure 220.

Referring to FIGS. 8E and 8F, to form the first superconducting material layer 230, first, a base material of the first superconducting material layer 230 may be deposited. Afterwards, for example, a tunnel thin film layer 240 may be formed by oxidizing a partial thickness of the deposited base material. In FIG. 8E, reference number 30' indicates a base material layer deposited for forming the first superconducting material layer 230. The base material layer 30' may include, for example, a superconducting material. In FIG. 8F, reference number 40' indicates an oxide layer formed by oxidizing a partial thickness of the base material layer 30' for forming the first superconducting material layer 230 to form the tunnel thin film layer 240. In this way, when the oxide layer 40' for forming the tunnel thin film layer 240 is formed by oxidizing a partial thickness of the base material layer 30', the oxide layer 40' may include an oxide of a superconducting material. For example, when the base material layer 30' includes aluminum, the oxide layer 40' for forming the tunnel thin film layer 240 may include an aluminum oxide. As another example, instead of oxidizing a partial thickness of the base material layer 30' for forming the first superconducting material layer 230, the oxide layer 40' for forming the tunnel thin film layer 240 may be separately formed, which may also be a superconducting material. The oxide layer 40' formed in this way may entirely cover the base material layer 30' for forming the first superconducting material layer 230. Hereinafter, the case in which the tunnel thin film layer 240 is formed by oxidizing a partial thickness of the base material is described.

Figure 8G:
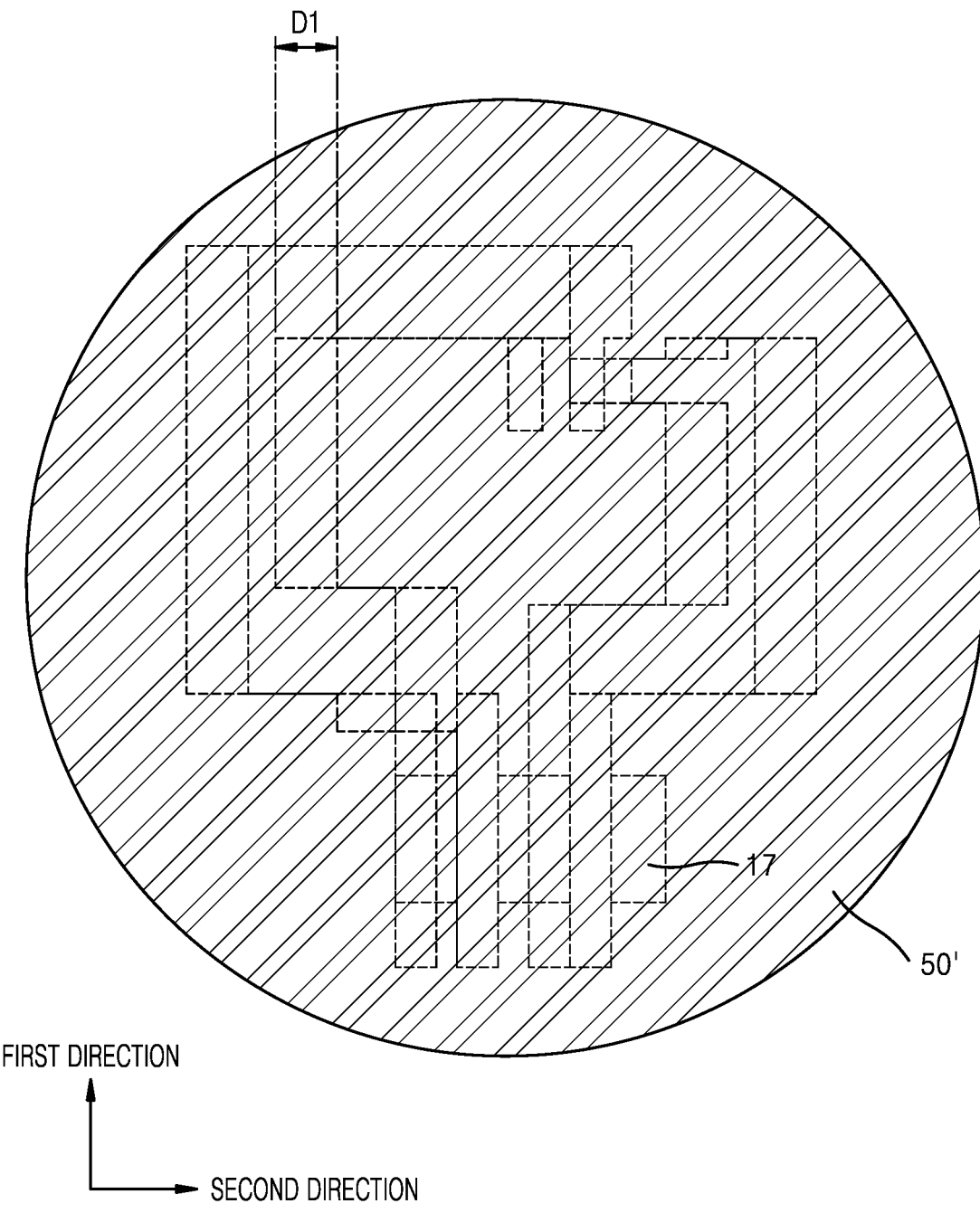

Next, referring to FIG. 8G, a base material layer 50' for forming a second superconducting material layer 250 that is shifted by a first width D1 in the second direction with respect to the pattern structure 220 may be deposited on the oxide layer 40' by utilizing a tilt angle and rotation of the substrate 1. When depositing the base material layer 50', the substrate 1 may be rotated, for example, 90 degrees. In this case, the shift may be performed in a direction in which at least a portion of the protrusion 253a of the first end unit 253 of the second superconducting material layer 250 overlaps the protrusion 232a of the second end unit 232 of the first superconducting material layer 230.

In this way, because the base material layer 50' for forming the second superconducting material layer 250 is formed by utilizing a tilt angle and rotation of the substrate 1, for example, by the pattern structure 220 of the resist layer 3 having a double layer structure, the second superconducting material layer 250 may be shifted or offset with respect to the first superconducting material layer 230, and the second superconducting material layer 250 may be formed in a structure without a protrusion of the second end unit 252 at a position where the tunnel Josephson junction 11 is formed, and without a first extension unit and a second extension unit at a position where the proximity Josephson junction 15 is formed.

Figure 8H:
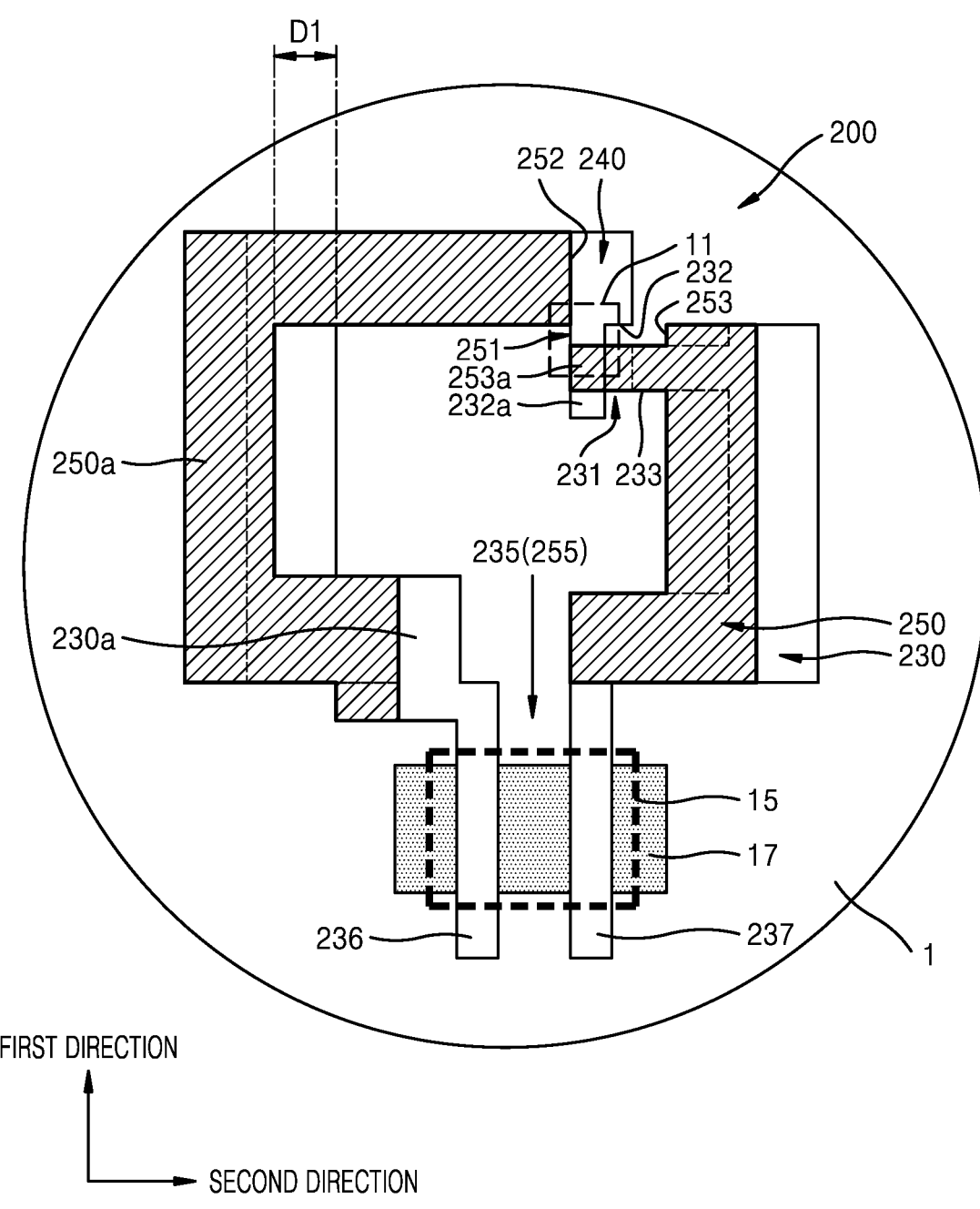

Next, referring to FIG. 8H, when the resist layer 3 is removed by using a lift off process, the SQUID 200 may be obtained having a structure in which the first superconducting material layer 230 has a shape corresponding to the pattern structure 220, the second superconducting material layer 250 has no protrusion from the second end unit 252 and no first and second extension units extending from the third and fourth end units in a shape corresponding to the pattern structure 220, and the second superconducting material layer 250 is shifted by the first width D1 in the second direction with respect to the first superconducting material layer 230. FIG. 8H shows an example of the SQUID 200 shown in FIG. 7 is manufactured on the substrate 1.

At this time, the tunnel thin film layer 240 may entirely cover the first superconducting material layer 230. In addition, the shifting direction of the second superconducting material layer 250 with respect to the first superconducting material layer 230 and the extension direction of the first and second extension units 236 and 237 of the first superconducting material layer 230 may be perpendicular to each other.

Accordingly, at the conductive material region 17, a proximity Josephson junction 15 is formed by a stack structure of the first extension unit 236 and the second extension unit 237 of the first superconducting material layer 230 and the conductive material region 17, in a position of the first separation structure 251 of the second superconducting material layer 250, the protrusion 253a of the first end unit 253 overlaps the protrusion 252a of the second end unit 252 of the first superconducting material layer 230 in a direction crossing each other, thus, a tunnel Josephson junction 11 including the protrusion 253a of the first end unit 253 of the second superconducting material layer 250, the tunnel thin film layer 240, and the second end unit 252 of the second superconducting material layer 250 may be formed. Because at least a portion of the first loop 230a of the first superconducting material layer 230 overlaps the second loop 250a of the second superconducting material layer 250, a Josephson junction is formed between the first loop 230a and the second loop 250a to form a superconducting loop. Thus, the SQUID 200 in which the proximity Josephson junction 15 and the tunnel Josephson junction 11 are connected through the superconducting loop may be obtained.

According to the SQUIDs 10, 100, and 200 and the manufacturing methods according to the embodiments described above, a hybrid structure including the proximity Josephson junction 15 and the tunnel Josephson junction 11 may be formed by a one-step fabrication method. Therefore, compared to prior methods of manufacturing SQUIDs, a bandage process may be omitted, damage to the Josephson junction may be reduced, and a failure in a process of connecting disparate types of Josephson junction devices when may be avoided.

In addition, according to the SQUIDs 10, 100, and 200 and the manufacturing method according to the embodiments, it is possible to manufacture the SQUIDs 10, 100, and 200 in a structure including different types of Josephson junction devices by a single resist process, and accordingly, contamination may be minimized by reducing the number of resist coating processes, the lift-off process may be reduced to one time, thereby saving time and preventing organic contamination. In addition, the number of times performing baking out required to resist coating may be reduced, thereby reducing the deterioration of devices during the baking process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The computing apparatuses, the electronic devices, the processors, the memories, the displays, the information output system and hardware, the storage devices, and other apparatuses, devices, units, modules, and components described herein with respect to FIGS. 1-8H are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8H that perform the operations described in this application may be performed at least in part by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EE- PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-Res, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A superconducting quantum interferometric device comprising:
  a conductive material region formed on a partial region of a substrate;
  a first superconducting material layer comprising a first loop comprising first and second extension units that are spaced apart from each other to form a proximity Josephson junction and that form a stack structure with the conductive material region;

a second superconducting material layer comprising a second loop comprising first and second end units spaced apart from each other; and
  a tunnel Josephson junction comprising a stack structure including a tunnel thin film layer and the first and second end units,
  wherein at least a portion of the second loop comprises a stack structure with the first loop.

2. The superconducting quantum interferometric device of claim 1, wherein the tunnel thin film layer covers at least a portion of the first loop, and a Josephson junction is formed between the first loop and the second loop.

3. The superconducting quantum interferometric device of claim 1, wherein the first superconducting material layer includes a third end unit and a fourth end unit spaced apart from each other, and
  the first and second extension units extend relative to the third and fourth end units.

4. The superconducting quantum interferometric device of claim 1, wherein the first loop and the second loop have respectively corresponding loop dimensions, and the first superconducting material layer and the second superconducting material layer form a stack structure in which the second superconducting material layer is offset by a first distance with respect to the first superconducting material layer.

5. The superconducting quantum interferometric device of claim 4, wherein a direction of offset of the second superconducting material layer with respect to the first superconducting material layer and an extension direction of the first and second extension units are opposite to or perpendicular to each other.

6. The superconducting quantum interferometric device of claim 1, wherein the first end unit of the second superconducting material layer includes one protrusion to form one tunnel Josephson junction or includes a plurality of protrusions to form a plurality of tunnel Josephson junctions.

7. The superconducting quantum interferometric device of claim 1, wherein the tunnel thin film layer comprises an oxide of superconducting material.

8. The superconducting quantum interferometric device of claim 7, wherein the tunnel thin film layer is formed by oxidizing a partial thickness of the first superconducting material layer.

9. The superconducting quantum interferometric device of claim 1, wherein the first superconducting material layer or the second superconducting material layer includes aluminum or niobium.

10. The superconducting quantum interferometric device of claim 1, wherein the conductive material region comprises graphene, a two-dimensional material, transition metal dichalcogenides (TMDC), a semiconductor material, or a metal material.

\* \* \* \* \*